US012693767B2

(12) United States Patent
Lee et al.

(10) Patent No.: US 12,693,767 B2
(45) **Date of Patent: *Jul. 28, 2026**

(54) DISPLAY PANEL AND ELECTRONIC APPARATUS

(71) Applicant: SAMSUNG DISPLAY CO., LTD., Yongin-si (KR)

(72) Inventors: Hyeonbum Lee, Yongin-si (KR); Seongmin Wang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/056,274

(22) Filed: Feb. 18, 2025

(65) Prior Publication Data

US 2025/0190082 A1      Jun. 12, 2025

Related U.S. Application Data

(63) Continuation of application No. 18/356,111, filed on Jul. 20, 2023, now Pat. No. 12,262,615, which is a
(Continued)

(30) Foreign Application Priority Data

Jun. 15, 2021      (KR) ........................ 10-2021-0077419

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC .............. H10K 59/40; H10K 59/00–95; G06F 3/041–047; G06F 2203/041–04114;
(Continued)

(56) References Cited

U.S. PATENT DOCUMENTS 10,168,844 B2    1/2019  Kwon et al.
11,069,752 B2    7/2021  Lee
(Continued)

FOREIGN PATENT DOCUMENTS

CN            108829283 B      3/2022
KR     10-2017-0083687          7/2017
(Continued)

*Primary Examiner* — Sanjiv D. Patel
(74) *Attorney, Agent, or Firm* — F. CHAU & ASSOCIATES, LLC

(57)            ABSTRACT

A display panel includes a plurality of emission areas disposed in a first display area and a second display area at least partially surrounded by the first display area. A transmission area is disposed between two adjacent emission areas in the second display area. An encapsulation layer is disposed on the emission areas. An input sensing layer is disposed on the encapsulation layer and includes touch electrodes. A reflection prevention layer is disposed on the input sensing layer and includes a light blocking layer and a plurality of color filters. The light blocking layer has a plurality of opening portions overlapping the emission areas. The plurality of color filters overlaps the emission areas. Each touch electrode includes a conductive mesh pattern having a plurality of mesh holes, and a particular emission area in the second display area and the transmission area are disposed in a same mesh hole.

20 Claims, 20 Drawing Sheets

Related U.S. Application Data continuation of application No. 17/647,119, filed on Jan. 5, 2022, now Pat. No. 11,744,133.

(51) Int. Cl.

| | |
|---|---|
| *H10K 59/122* | (2023.01) |
| *H10K 59/38* | (2023.01) |
| *H10K 59/40* | (2023.01) |
| *H10K 59/65* | (2023.01) |
| *H10K 59/80* | (2023.01) |

(52) U.S. Cl.
CPC ........... *H10K 59/122* (2023.02); *H10K 59/38* (2023.02); *H10K 59/40* (2023.02); *H10K 59/65* (2023.02); *H10K 59/873* (2023.02); *H10K 59/8791* (2023.02); *G06F 2203/04112* (2013.01)

(58) Field of Classification Search
CPC ......... G06F 3/0446; G06F 2203/04112; G06F 3/0448; G06V 40/1318
See application file for complete search history.

(56) References Cited

U.S. PATENT DOCUMENTS

| | | | |
|---|---|---|---|
| 11,744,133 B2 | 8/2023 | Lee et al. | |
| 2015/0346866 A1 | 12/2015 | Kusunoki et al. | |
| 2018/0018047 A1 | 1/2018 | Iwami | |
| 2020/0133040 A1* | 4/2020 | Bang ..................... | G02F 1/1333 |
| 2020/0295092 A1 | 9/2020 | Moon et al. | |
| 2021/0066648 A1 | 3/2021 | Chung et al. | |
| 2021/0167144 A1* | 6/2021 | Lim ..................... | H10K 59/875 |
| 2022/0399405 A1 | 12/2022 | Lee et al. | |
| 2022/0413656 A1 | 12/2022 | Wang | |
| 2023/0363238 A1 | 11/2023 | Lee et al. | |

FOREIGN PATENT DOCUMENTS

| | | | |
|---|---|---|---|
| KR | 10-2020-0050059 A | | 5/2020 |
| KR | 10-2020-0096357 | | 8/2020 |
| KR | 10-2021-0028296 | | 3/2021 |
| KR | 10-2021-0069776 A | | 6/2021 |

* cited by examiner

DISPLAY PANEL AND ELECTRONIC APPARATUS

CROSS-REFERENCE TO RELATED APPLICATION

This application is a Continuation of co-pending U.S. patent application Ser. No. 18/356,111, filed on Jul. 20, 2023, which is a Continuation of U.S. patent application Ser. No. 17/647,119, filed on Jan. 5, 2022 (issued on Aug. 29, 2023 as U.S. Pat. No. 11,744,133) which claims priority under 35 U.S.C. § 119 to Korean Patent Application No. 10-2021-0077419, filed on Jun. 15, 2021, in the Korean Intellectual Property Office, the disclosures of which are incorporated by reference herein in their entirety.

TECHNICAL FIELD

The present disclosure relates to a display panel and, more specifically, to a display panel and an electronic apparatus including the same.

DISCUSSION OF THE RELATED ART

Recently, display panels have been used in a wide range of devices. In addition, display panels have become thinner and lighter allowing display panels to find even more uses.

Display panels have also been made to be larger in recent years. Now, as display panels take up a larger proportion of the available front surface of the devices they have been integrated into, and the surrounding bezels that would previously house electronic elements have shrunk in size, designers have been incorporating other electronic devices into the display panel that perform functions other than displaying an image.

SUMMARY

A display panel includes a plurality of emission areas arranged in a first display area and a second display area. The second display area is at least partially surrounded by the first display area. A transmission area is disposed in the second display area. The transmission area is disposed between two adjacent emission areas, of the plurality of emission areas, disposed in the second display area. An encapsulation layer is disposed on the plurality of emission areas. An input sensing layer is disposed on the encapsulation layer and includes touch electrodes. A reflection prevention layer is disposed on the input sensing layer and includes a light blocking layer and a plurality of color filters. The light blocking layer includes a plurality of opening portions overlapping the plurality of emission areas. The plurality of color filters overlaps the plurality of emission areas. Each of the touch electrodes includes a conductive mesh pattern having a plurality of mesh holes. A particular emission area, of the plurality of emission areas, in the second display area and the transmission area are located in a same mesh hole, of the plurality of mesh holes, in a plan view.

The light blocking layer may overlap the conductive mesh pattern and may include a partition portion extending between the particular emission area and the transmission area located in the same mesh hole.

The partition portion of the light blocking layer may be overlapped by a color filter that is disposed on the particular emission area.

Each of the plurality of emission areas may include a light-emitting diode including a first electrode, an emission layer disposed on the first electrode, a second electrode disposed on the emission layer, and a bank layer covering an edge of the first electrode and having a first opening overlapping the first electrode and a second opening corresponding to the transmission area. A width of the emission area may be defined by the first opening of the bank layer.

The bank layer may include a light blocking material.

The light blocking layer may include an opening portion corresponding to the transmission area, and a width of the second opening of the bank layer may be less than a width of the opening portion of the light blocking layer.

The light blocking layer may include an opening portion corresponding to the transmission area, and a width of the second opening of the bank layer may be greater than a width of the opening portion of the light blocking layer.

A number of emission areas disposed in the first display area may be the same as a number of emission areas disposed in the second display area, for a given area.

The light blocking layer may include a transmissive opening portion corresponding to the transmission area. The reflection prevention layer may further include an overcoat layer disposed on the plurality of color filters and the light blocking layer, and a portion of the overcoat layer may at least partially fill the transmissive opening portion of the light blocking layer.

The plurality of emission areas may include adjacent emission areas disposed in the second display area and emitting light of different colors from each other. The plurality of color filters may include a first color filter and a second color filter respectively disposed on the adjacent emission areas. The first color filter and the second color filter may overlap each other on a portion of the light blocking layer, the portion corresponding to a space between the adjacent emission areas.

The plurality of emission areas may include adjacent emission areas disposed in the second display area and emitting light of different colors from each other. The plurality of color filters may include a first color filter and a second color filter respectively disposed on the adjacent emission areas. The first color filter and the second color filter may overlap a third color filter on a portion of the light blocking layer, the portion corresponding to a space between the adjacent emission areas. The third color filter may have a different color from the first and second color filters.

A conductive line corresponding to any one of the plurality of touch electrodes may be disposed below the portion of the light blocking layer. On the portion of the light blocking layer, an overlapping area between the first color filter and the third color filter might not overlap the conductive line, and an overlapping area between the second color filter and the third color filter might not overlap the conductive line.

A display apparatus includes a display panel including a plurality of emission areas arranged in a first display area and a second display area. The second display area is at least partially surrounded by the first display area, and a transmission area is disposed between two adjacent emission areas, of the plurality of emission areas, in the second display area. A first component is disposed below the display panel and is located in the second display area. The display panel further includes an encapsulation layer disposed on the plurality of emission areas, an input sensing layer disposed on the encapsulation layer and including touch electrodes, and a reflection prevention layer disposed on the input sensing layer and including a light blocking layer and a plurality of color filters. The light blocking layer has a plurality of opening portions overlapping the plurality of emission areas, and the plurality of color filters overlap the plurality of emission areas. Each of the touch electrodes includes a conductive mesh pattern having a plurality of mesh holes, and a particular emission area, of the plurality of emission areas, in the second display area and the transmission area are located in a same mesh hole, of the plurality of mesh holes, in a plan view.

The light blocking layer may overlap the conductive mesh pattern and may include a partition portion extending between the particular emission area and the transmission area located in the same mesh hole.

The partition portion of the light blocking layer may overlap a color filter that is disposed on the particular emission area.

Each of the plurality of emission areas may include a light-emitting diode including a first electrode, an emission layer disposed on the first electrode, and a second electrode disposed on the emission layer, and a bank layer covering an edge of the first electrode and having a first opening overlapping the first electrode and a second opening corresponding to the transmission area. A width of the emission area may be defined by the first opening of the bank layer.

The bank layer may include a light blocking material.

The light blocking layer may include an opening portion corresponding to the transmission area, and a width of the second opening of the bank layer may be less than a width of the opening portion.

The light blocking layer may include an opening portion corresponding to the transmission area, and a width of the second opening of the bank layer may be greater than a width of the opening portion.

A number of emission areas disposed in the first display area may be the same as a number of emission areas disposed in the second display area, for a given area.

The light blocking layer may include a transmissive opening portion corresponding to the transmission area. The reflection prevention layer may further include an overcoat layer disposed on the plurality of color filters and the light blocking layer. A portion of the overcoat layer may at least partially fill the transmissive opening portion.

The plurality of emission areas may include the adjacent pair of the emission areas disposed in the second display area and emitting light of different colors from each other. The plurality of color filters may include a first color filter and a second color filter respectively disposed on the adjacent emission areas. The first color filter and the second color filter may overlap each other on a portion of the light blocking layer, the portion corresponding to a space between the adjacent emission areas.

The plurality of emission areas may include the adjacent emission areas disposed in the second display area and emitting light of different colors from each other. The plurality of color filters may include a first color filter and a second color filter respectively disposed on the adjacent emission areas. The first color filter and the second color filter may overlap a third color filter disposed on a portion of the light blocking layer, the portion corresponding to a space between the adjacent emission areas. The third color filter may be of a different color than each of the first and second color filters.

A conductive line corresponding to any one of the touch electrodes may be disposed below the portion of the light blocking layer. On the portion of the light blocking layer, an overlapping area between the first color filter and the third color filter might not overlap the conductive line, and an overlapping area between the second color filter and the third color filter might not overlap the conductive line.

The first component may include a sensor using light.

The display panel may further include a third display area spaced apart from the second display area, including a transmission area, and the third display area may be at least partially surrounded by the first display area. A second component may be disposed below the display panel and may overlap the third display area.

The second component may be different from the first component.

BRIEF DESCRIPTION OF THE DRAWINGS

The above and other aspects and features of certain embodiments of the disclosure will be more apparent from the following description taken in conjunction with the accompanying drawings, in which:

FIGS. 2 and 3 are perspective views of a foldable electronic apparatus according to an embodiment of the present disclosure, wherein FIG. 2 shows a folded state of the foldable electronic apparatus and FIG. 3 shows an unfolded state of the foldable electronic apparatus;

DETAILED DESCRIPTION

Figure 1:
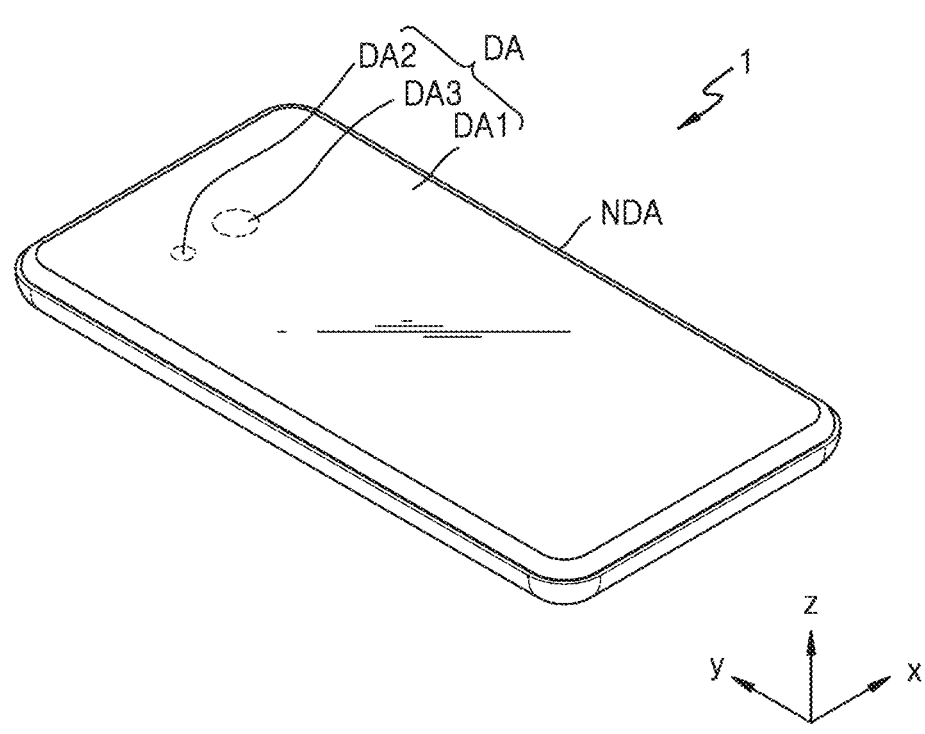
FIG. 1 is a perspective view of an electronic apparatus according to an embodiment of the present disclosure.

Reference will now be made in detail to various embodiments of the present disclosure, examples of which are illustrated in the accompanying drawings, wherein like reference numerals may refer to like elements throughout the specification and the drawings. In this regard, the present embodiments may have different forms and should not be construed as necessarily being limited to the descriptions set forth herein. Accordingly, the embodiments set forth herein are described, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not necessarily limited to the embodiments disclosed hereinafter and may be realized in various forms.

Hereinafter, embodiments of the disclosure will be described in detail by referring to the accompanying drawings. In descriptions with reference to the drawings, the same reference numerals may be given to components that are the same or substantially the same and to the extent that a description of an element is not provided, it may be assumed that the element is at least similar to a corresponding element described elsewhere within the instant specification.

It will be understood that although the terms "first," "second," etc. may be used herein to describe various components, these components should not necessarily be limited by these terms. These components are used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. For example, intervening layers, regions, or elements may be present.

The expression "at least one of A and B" may indicate a case in which A is included, a case in which B is included, or a case in which A and B are included.

Sizes of elements in the drawings may be exaggerated for convenience of explanation. For example, sizes and thicknesses of the elements in the drawings may be provided for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it can be directly or indirectly in contact with or electrically connected to the other element, area, or layer.

FIG. 1 is a perspective view of an electronic apparatus 1 according to an embodiment of the present disclosure.

The electronic apparatus 1, according to an embodiment of the present disclosure, may be an apparatus for displaying a video or a static image. The electronic apparatus 1 may be used as a display screen of various devices, such as a television, a notebook computer, a monitor, a broadcasting panel, and an Internet of things (IoT) device, as well as portable electronic devices, such as a mobile phone, a smartphone, a tablet personal computer (PC), a mobile communication terminal, an electronic notebook, an electronic book, a portable multimedia player (PMP), a navigation device, and an ultra mode PC (UMPC). Also, the electronic apparatus 1, according to an embodiment of the present disclosure, may be used in wearable devices, such as a smart watch, a watch phone, a glasses-type display, and a head-mounted display (HMD). Also, the electronic apparatus 1, according to an embodiment of the present disclosure, may be used as: a gauge of a vehicle, a center fascia of a vehicle, or a center information display on a dashboard; a room mirror display substituting a side-view mirror of a vehicle; or a display disposed on a rear surface of a front seat, as an entertainment device for a backseat of a vehicle. FIG. 1 illustrates the electronic apparatus 1, which is used as a smartphone, for convenience of explanation.

Referring to FIG. 1, the electronic apparatus 1 may include a display area DA and a non-display area NDA that is disposed beyond the display area DA. The electronic apparatus 1 may provide an image through a plurality of pixel arrays that are two-dimensionally arranged in the display area DA.

The non-display area NDA is an area not displaying an image (e.g., not including display pixels) and may completely, or partially, surround the display area DA. In the non-display area NDA, a driver, etc. for providing an electrical signal or power to display elements arranged in the display area DA may be arranged. In the non-display area NDA, a pad, to which an electronic element, a printed circuit board, etc. may be electrically connected, may be arranged.

The display area DA may include a first display area DA1, a second display area D2, and a third display area DA3. The second display area DA2 and the third display area DA3 may be areas in which components for adding various functions to the electronic apparatus 1 may be arranged, and the second display area DA2 may correspond to a component area. The first display area DA1 might be free of such components.

Figure 2:
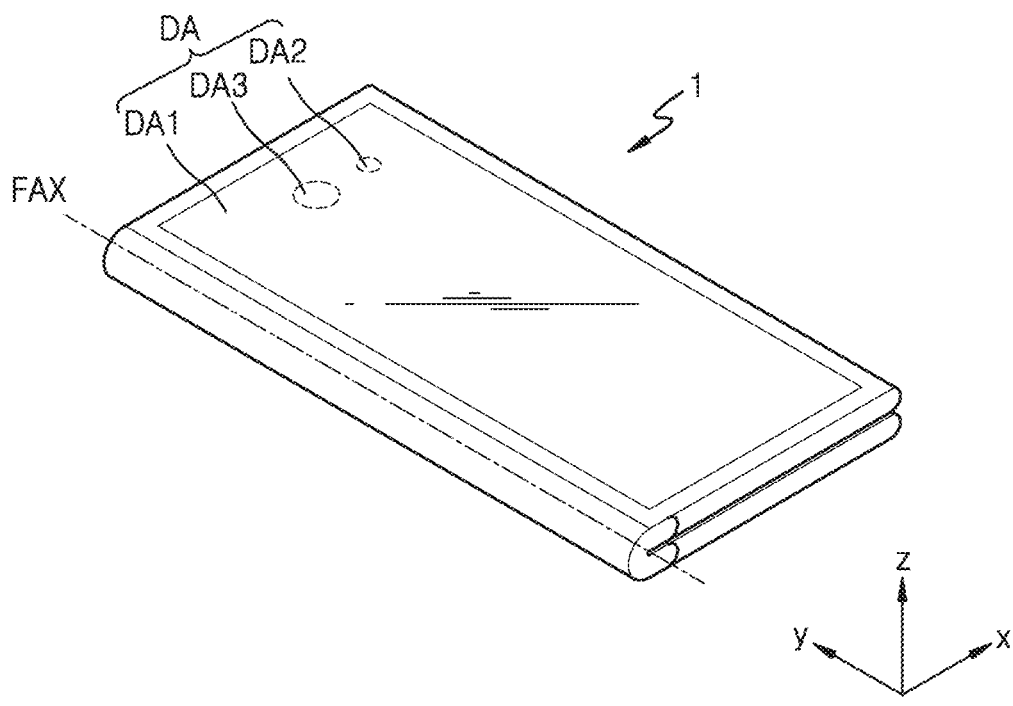
Figure 3:
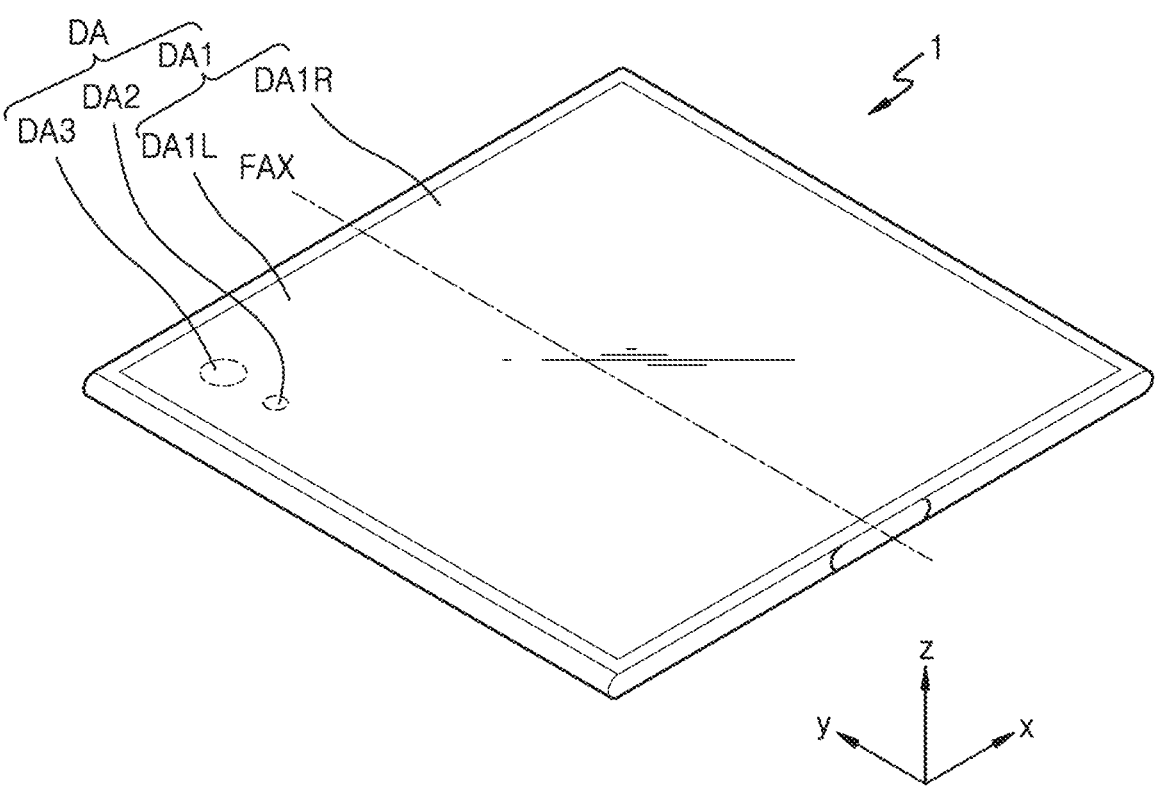

FIGS. 2 and 3 are perspective views of a foldable electronic apparatus according to an embodiment of the present disclosure, wherein FIG. 2 shows a folded state of the foldable electronic apparatus and FIG. 3 shows an unfolded state of the foldable electronic apparatus.

The electronic apparatus 1, according to an embodiment of the present disclosure, may be a foldable electronic apparatus. The electronic apparatus 1 may be folded about a folding axis FAX. The display area DA may be located at an outer portion and/or an inner portion of the electronic apparatus 1. According to an embodiment of the present disclosure, FIGS. 2 and 3 respectively illustrate that the display area DA is located at the outer portion and the inner portion of the electronic apparatus 1.

Referring to FIG. 2, the display area DA may be disposed at the outer portion of the electronic apparatus 1. An outer surface of the electronic apparatus 1, which is foldable, may include the display area DA, and the display area DA may include: the first display area DA1 occupying a greatest area of the display area DA; and the second and third display areas D2 and D3 having less areas than the first display area DA1.

Referring to FIG. 3, the display area DA may be disposed at the inner portion of the electronic apparatus 1. An inner surface of the electronic apparatus 1, which is foldable, may include the display area DA, and the display area DA may include: the first display area DA1 occupying a greatest area of the display area DA; and the second and third display areas D2 and D3 having less areas than the first display area DA1.

FIG. 3 illustrates that the first display area DA1 may include a left display area DA1L and a right display area DA1R that are respectively located at opposite sides of the folding axis FAX, and the second and third display areas D2 and D3 may be located in the left display area DA1L. However, the disclosure is not necessarily limited thereto. According to an embodiment of the present disclosure, the second and third display areas DA2 and DA3 may be disposed in the right display area DA1R. According to an embodiment of the present disclosure, one of the second and third display areas DA2 and DA3 may be disposed in the left display area DA1L, and the other may be disposed in the right display area DA1R.

As illustrated in FIGS. 1, 2, and 3, an area of each of the second and third display areas DA2 and DA3 may be less than an area of the first display area DA1. The second display area DA2 and the third display area DA3 may have different sizes (e.g., areas) from each other. With respect to this aspect, FIGS. 1 and 2 illustrate that the size (e.g., the area) of the second display area DA2 is less than the size (e.g., the area) of the third display area DA3.

Figure 4:
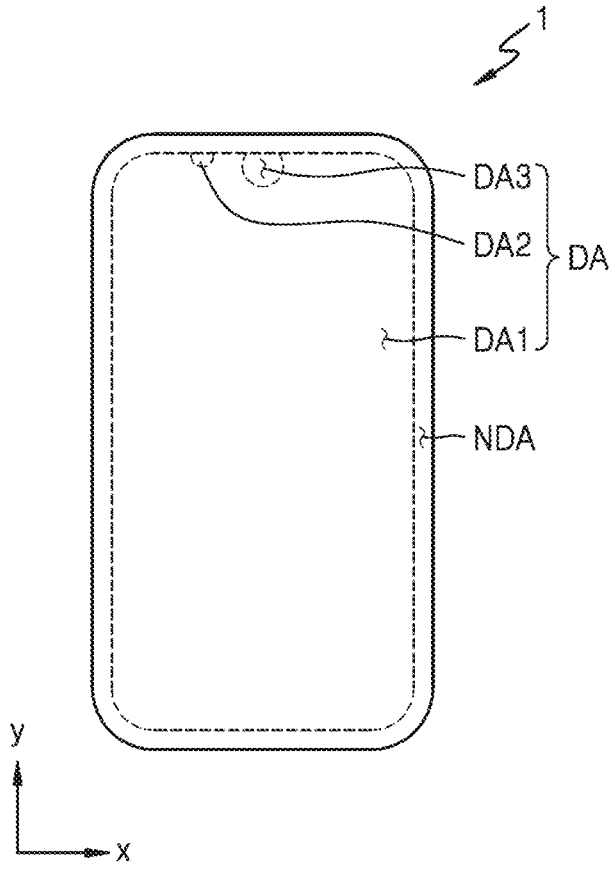
FIG. 4 is a schematic plan view of an electronic apparatus according to an embodiment of the present disclosure.

FIGS. 1 through 3 illustrate that each of the second and third display areas DA2 and DA3 may be completely surrounded by the first display area DA1. However, the disclosure is not necessarily limited thereto. FIG. 4 is a schematic plan view of an electronic apparatus according to an embodiment of the present disclosure. As illustrated in FIG. 4, each of the second and third display areas DA2 and DA3 may be partially surrounded by the first display area DA1.

Figure 5A:
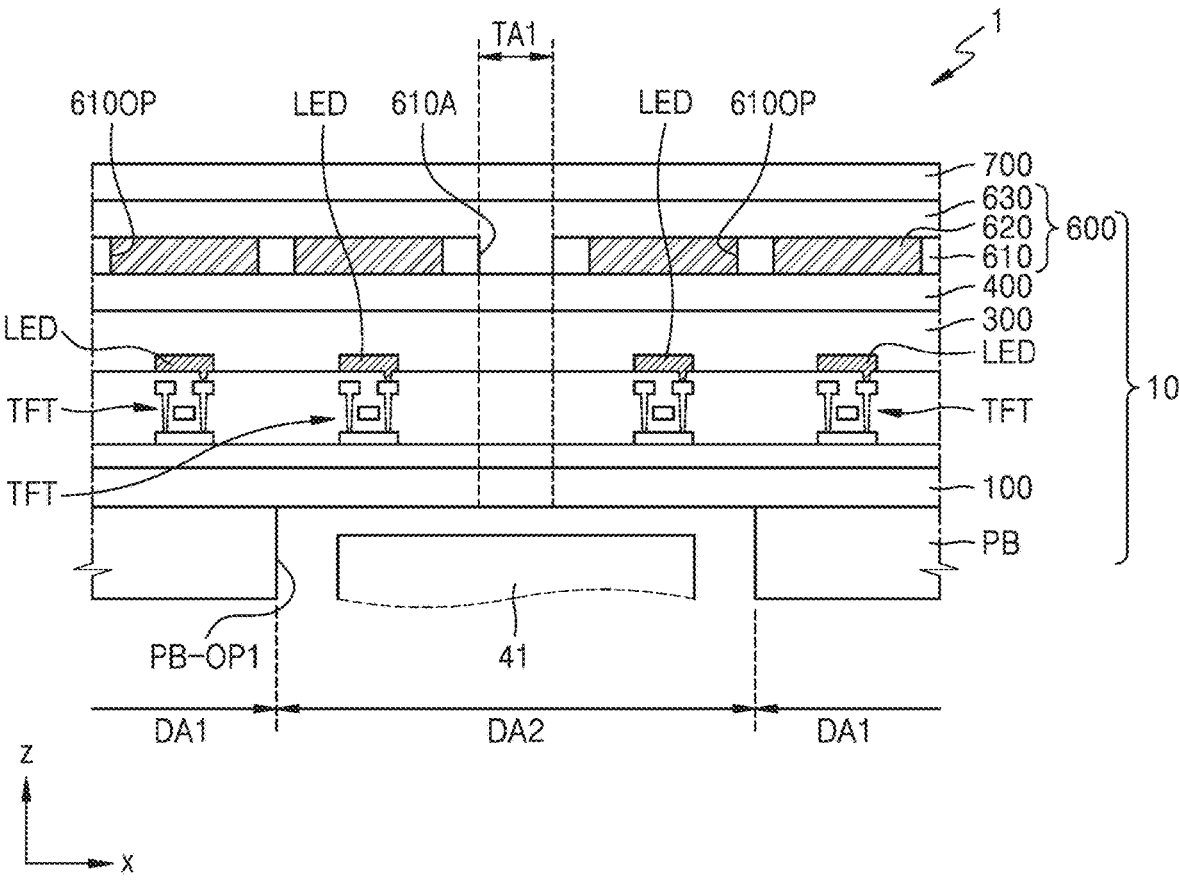
FIGS. 5A and 5B are cross-sectional views of a portion of an electronic apparatus according to an embodiment of the present disclosure.
Figure 5B:
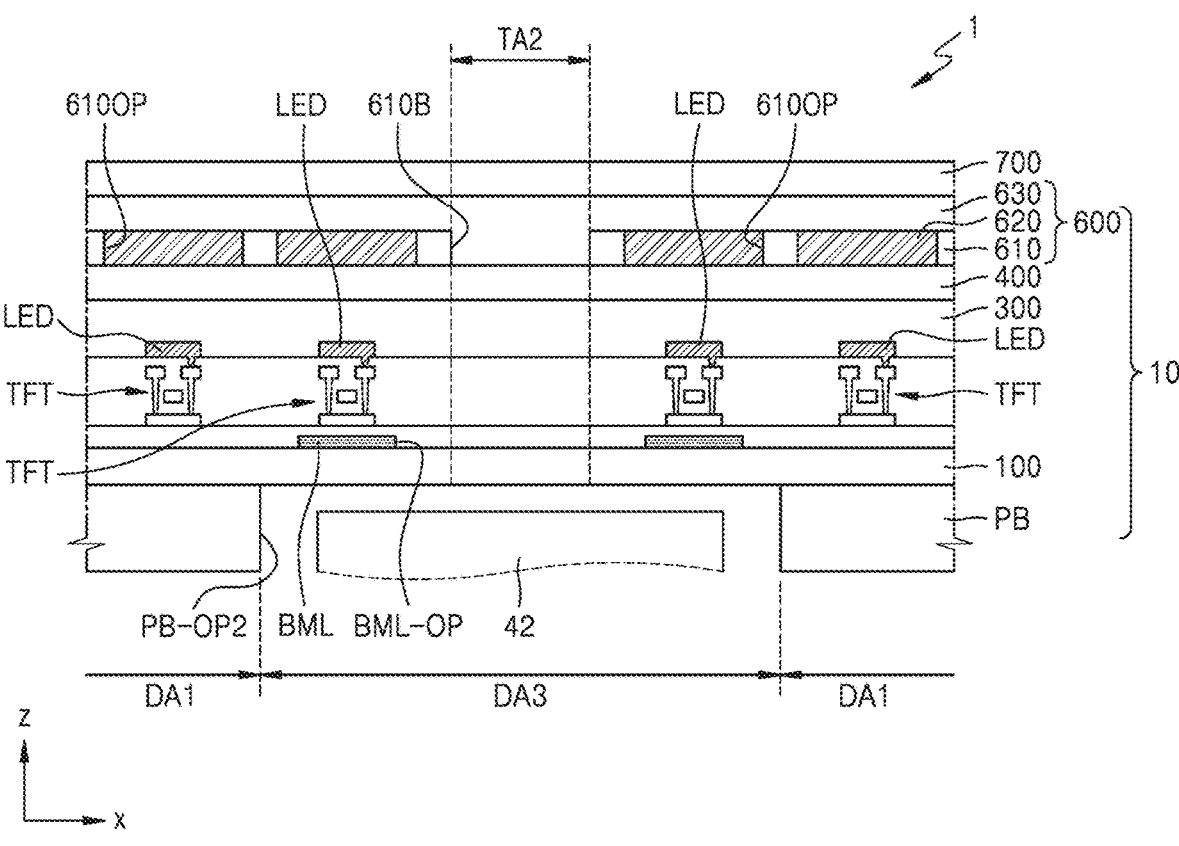

FIGS. 5A and 5B are cross-sectional views of a portion of the electronic apparatus 1 according to an embodiment of the present disclosure.

Referring to FIGS. 5A and 5B, the electronic apparatus 1 may include a display panel 10 and a component disposed below the display panel 10 overlapping the display panel 10. The a component may correspond to the second display area DA2. As illustrated in FIGS. 5A and 5B, a first component 41 may be disposed in the second display area DA2, and a second component 42 may be disposed in the third display area DA3.

The display panel 10 may include a substrate 100, a thin-film transistor TFT disposed on the substrate 100, a display element (for example, a light-emitting diode LED) electrically connected to the thin-film transistor TFT, an encapsulation layer 300 covering the display element, an input sensing layer 400, a reflection prevention layer 600, and a window 700.

The substrate 100 may include glass or polymer resins. The substrate 100 including polymer resins may be flexible, foldable, rollable, or bendable. The substrate 100 may have a multi-layered structure including a layer including the polymer resins described above and an inorganic layer.

A lower protection film PB may be disposed on a lower surface of the substrate 100. The lower protection film PB may be coupled to the lower surface of the substrate 100. An adhesive layer may be arranged between the lower protection film PB and the substrate 100. Alternatively, the lower protection film PB may be directly formed on the lower surface of the substrate 100, and in this case, the adhesive layer might not be arranged between the lower protection film PB and the substrate 100.

The lower protection film PB may support and protect the substrate 100. The lower protection film PB may include openings PB-OP1 and PB-OP2 corresponding to the second display area DA2 and the third display area DA3, respectively. The lower protection film PB may include an organic insulating material, such as polyethylene terephthalate (PET) or polyimide (PI).

The thin-film transistor TFT and the light-emitting diode LED, which is a display element electrically connected to the thin-film transistor TFT, may be disposed on an upper surface of the substrate 100. The light-emitting diode LED may be an organic light-emitting diode including an organic material. The organic light-emitting diode may emit red, green, and/or blue light.

The light-emitting diode LED may be an inorganic light-emitting diode including an inorganic material. The inorganic light-emitting diode may include a PN junction diode including inorganic semiconductor-based materials. When a voltage is applied to the PN junction diode in a normal direction, holes and electrons may be injected into the PN junction diode, and energy generated by recombination of holes and the electrons may be converted into light energy to emit a certain color of light. The inorganic light-emitting diode described above may have a width that is several to hundreds of micrometers or several to hundreds of nanometers (or may be between several nanometers and several hundreds of micrometers). In some embodiments of the present disclosure, the light-emitting diode LED may include a quantum dot light-emitting diode. An emission layer of the light-emitting diode LED may include an organic material, an inorganic material, quantum dots, an organic material and quantum dots, or an inorganic material and quantum dots.

The light-emitting diode LED may be electrically connected to the thin-film transistor TFT disposed therebelow. The thin-film transistor TFT and the light-emitting diode LED may be disposed in each of the first through third display areas DA1 through DA3.

A transmission area may be located in the second display area DA2 and the third display area DA3. As illustrated in FIG. 5A, a transmission area TA1 (hereinafter, referred to as a first transmission area) between adjacent light-emitting diodes LEDs may be disposed in the second display area DA2, and a transmission area TA2 (hereinafter, referred to as a second transmission area) between adjacent light-emitting diodes LEDs may be disposed in the third display area DA3.

The first and second transmission areas TA1 and TA2 may be areas through which light emitted from and/or progressing toward the first and second components 41 and 42 may be transmitted, respectively. In the display panel 10, a transmission rate of the transmission area TA may be about equal to or greater than about 30%, equal to or greater than about 40%, equal to or greater than about 50%, equal to or greater than about 60%, equal to or greater than about 70%, equal to or greater than about 75%, equal to or greater than about 80%, equal to or greater than about 85%, or equal to or greater than about 90%.

Each of the first and second components 41 and 42 may include: a sensor, such as a proximity sensor, an illumination sensor, an iris sensor, or a face recognition sensor; and a camera (or an image sensor). Each of the first and second components 41 and 42 may generate and/or sense light. For example, the first and second components 41 and 42 may emit and/or receive light of bands of infrared light, ultraviolet light, and visible light. A proximity sensor using infrared light may detect an object arranged near to an upper surface of the electronic apparatus 1, and an illumination sensor may detect a brightness of light incident into the upper surface of the electronic apparatus 1. Also, an iris sensor may capture an image of an iris of a human above the upper surface of the electronic apparatus 1, and a camera may receive light with respect to an object arranged on the upper surface of the electronic apparatus 1.

The first and second components 41 and 42 may be different from each other. In some embodiments of the present disclosure, the first component 41 may include a sensor, such as a proximity sensor, an illumination sensor, an iris sensor, and a face recognition sensor, and the second component 42 may include a camera (or an image sensor).

In order to prevent the degradation of the function of the thin-film transistor TFT disposed in the second display area DA2 and/or the third display area DA3 due to light transmitted through the first transmission area TA1 and/or the second transmission area TA2, a light blocking metal layer BML may be disposed between the substrate 100 and the thin-film transistor TFT. According to an embodiment of the present disclosure, FIG. 5B illustrates that the light blocking metal layer BML may be located in the third display area DA3. The light blocking metal layer BML may include an opening BML-OP corresponding to (e.g., overlapping/exactly overlapping) the second transmission area TA2. The light blocking metal layer BML might not be located in the first display area DA1 and the second display area DA2. According to an embodiment of the present disclosure, a light blocking metal layer including an opening corresponding to the first transmission area TA1 may be arranged in the second display area DA2.

The encapsulation layer 300 may cover the light-emitting diodes LEDs. The encapsulation layer 300 may include at least one inorganic encapsulation layer and at least one organic encapsulation layer.

The input sensing layer 400 may be formed on the encapsulation layer 300. The input sensing layer 400 may obtain coordinate information according to an external input, for example, a touch event of a finger or an object such as a stylus pen. The input sensing layer 400 may include a touch electrode and trace lines connected to the touch electrode. The input sensing layer 400 may sense the external input by using a mutual cap method or a self-cap method.

The reflection prevention layer 600 may reduce a reflectivity of light (e.g., external light) that is incident toward the display panel 10 from the outside. The reflection prevention layer 600 may include a light blocking layer 610, color filters 620, and an overcoat layer 630. The light blocking layer 610 may include openings 610OP overlapping the light-emitting diodes LED in the first through third display areas DA1, DA2, and DA3, and the color filters 620 may be arranged in the openings 610OP, respectively.

The light blocking layer 610 may include an opening portion (hereinafter, referred to as a transmissive opening portion) corresponding to the transmission area, for example, the first and second transmission areas TA1 and TA2. The light blocking layer 610 may include, as illustrated in FIG. 5A, a first transmissive opening portion 610A corresponding to the first transmission area TA1 provided in the second display area DA2, and may include, as illustrated in FIG. 5B, a second transmissive opening portion 610B corresponding to the second transmission area TA2 provided in the third display area DA3.

The overcoat layer 630 may include a colorless transmissive material, and a portion of the overcoat layer 630 may at least partially fill the first and second transmissive opening portions 610A and 610B.

The window 700 may be disposed on the reflection prevention layer 600. The window 700 may be coupled to the reflection prevention layer 600 via an adhesive layer, such as an optically clear adhesive (OCA). The window 700 may include a glass material or a plastic material. The glass material may include ultra-thin glass. The plastic material may include polyether sulfone, polyacrylate, polyether imide, polyethylene naphthalate, PET, polyphenylene sulfide, polyarylate, PI, polycarbonate, cellulose acetate propionate, or the like.

Figure 6:
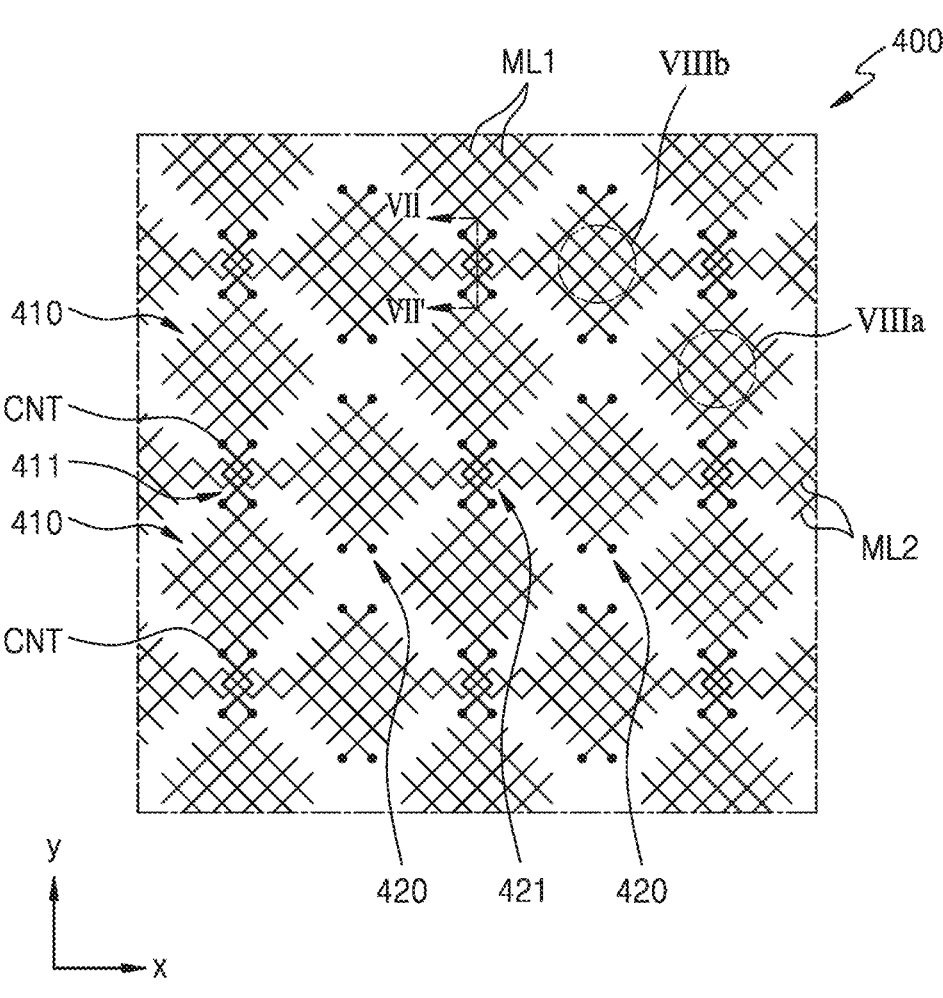
FIG. 6 is a plan view of an input sensing layer of a display apparatus according to an embodiment of the present disclosure.
Figure 7:
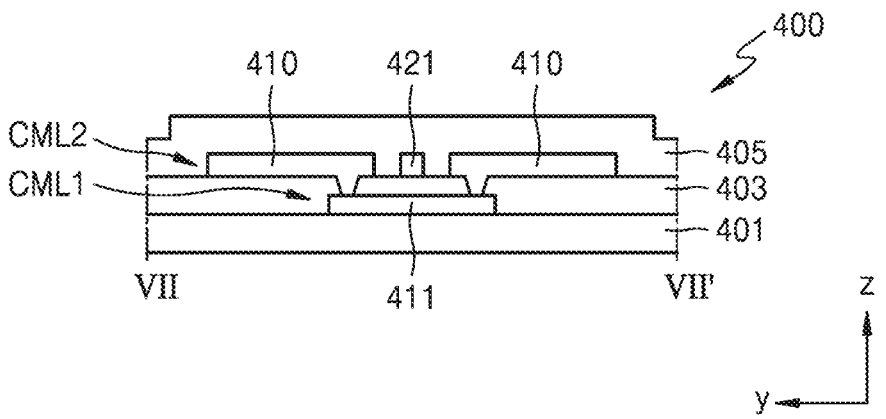
FIG. 7 is a cross-sectional view of the input sensing layer of FIG. 6, taken along line VII-VII'.
Figure 8A:
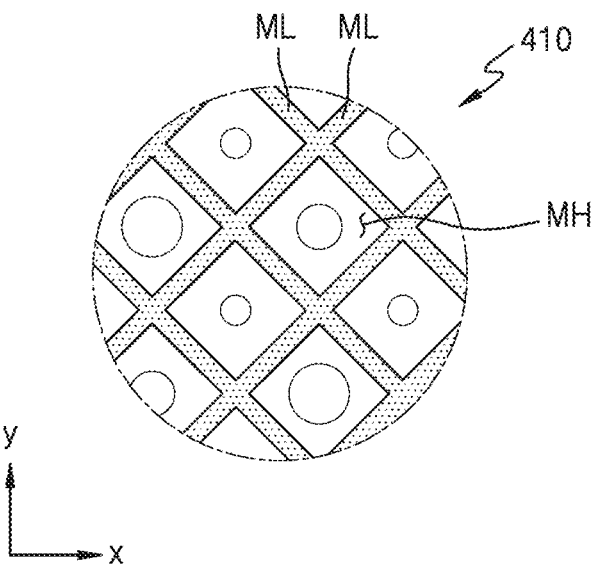
FIG. 8A is an enlarged plan view of region VIIIa of FIG. 6.
Figure 8B:
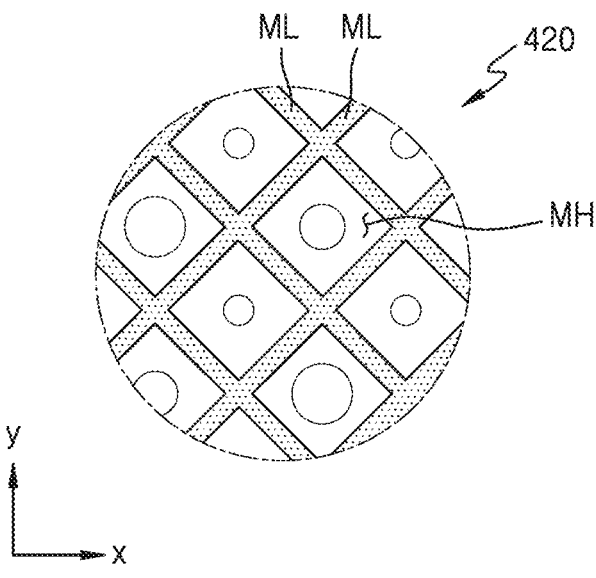
FIG. 8B is an enlarged plan view of region VIIIb of FIG. 6.

FIG. 6 is a plan view of an input sensing layer of a display apparatus according to an embodiment of the present disclosure, FIG. 7 is a cross-sectional view of the input sensing layer, taken along line VII-VII' of FIG. 6, FIG. 8A is an enlarged plan view of region VIIIa of FIG. 6, and FIG. 8B is an enlarged plan view of region VIIIb of FIG. 6.

The input sensing layer 400 may include a plurality of touch electrodes. According to an embodiment of the present disclosure, FIG. 6 illustrates that the touch electrodes may include first touch electrodes 410 and second touch electrodes 420. The first touch electrodes 410 and the second touch electrodes 420 may be arranged in the display area and may cross each other.

The first touch electrodes 410 may be arranged in a y direction, and the second touch electrodes 420 may be arranged in an x direction crossing the y direction. The first touch electrodes 410 arranged in the y direction may be connected to each other via a first connection electrode 411 between an adjacent pair of the first touch electrodes 410. The second touch electrodes 420 arranged in the x direction may be connected to each other via a second connection electrode 421 between an adjacent pair of the second touch electrodes 420.

The first touch electrodes 410 and the second touch electrodes 420 may have a conductive mesh pattern as illustrated in FIGS. 6, 8A, and 8B. For example, the conductive mesh pattern of the first touch electrode 410 may include conductive lines ML1 (hereinafter, referred to as first conductive lines), and the conductive mesh pattern of the second touch electrode 420 may include conductive lines ML2 (hereinafter, referred to as second conductive lines) insulated from the first conductive lines ML1. The first conductive lines ML1 and the second conductive lines ML2 may include Mo, Mb, Ag, Ti, Cu, Al, and/or an alloy thereof.

Each of the first touch electrode 410 and the second touch electrode 420 may have the conductive mesh pattern, and thus, may include holes (hereinafter, referred to as mesh holes MH) as illustrated in FIGS. 8A and 8B. Each of the mesh holes MH may be defined by being completely surrounded by the conductive lines corresponding thereto, and the mesh holes MH may be spaced apart from each other.

Like the first touch electrode 410 and the second touch electrode 420, the first connection electrode 411 and the second connection electrode 412 may include conductive mesh patterns including conductive lines. The conductive lines of the first and second connection electrodes 411 and 412 may also include mesh holes as illustrated in FIGS. 8A and 8B.

As illustrated in FIG. 7, the input sensing layer 400 may include a first touch insulating layer 401, a first conductive layer CML1, a second touch insulating layer 403, a second conductive layer CML2, and a third touch insulating layer 405. The first conductive layer CML1 may include the first connection electrode 411, and the second conductive layer CML2 may include the first touch electrode 410, the second touch electrode 420, and the second connection electrode 421. According to an embodiment of the present disclosure, any one of the first and second touch electrodes 410 and 420 may be provided in the first conductive layer CML1 and the other may be provided in the second conductive layer CML2. The first through third touch insulating layers 401, 403, and 405 may include an insulating material. According to an embodiment of the present disclosure, the first through third touch insulating layers 401, 403, and 405 may include an inorganic insulating material, such as silicon oxide, silicon nitride, and/or silicon oxynitride. According to an embodiment of the present disclosure, at least one of the first through third touch insulating layers 401, 403, and 405 may include an organic insulating material.

Figure 9:
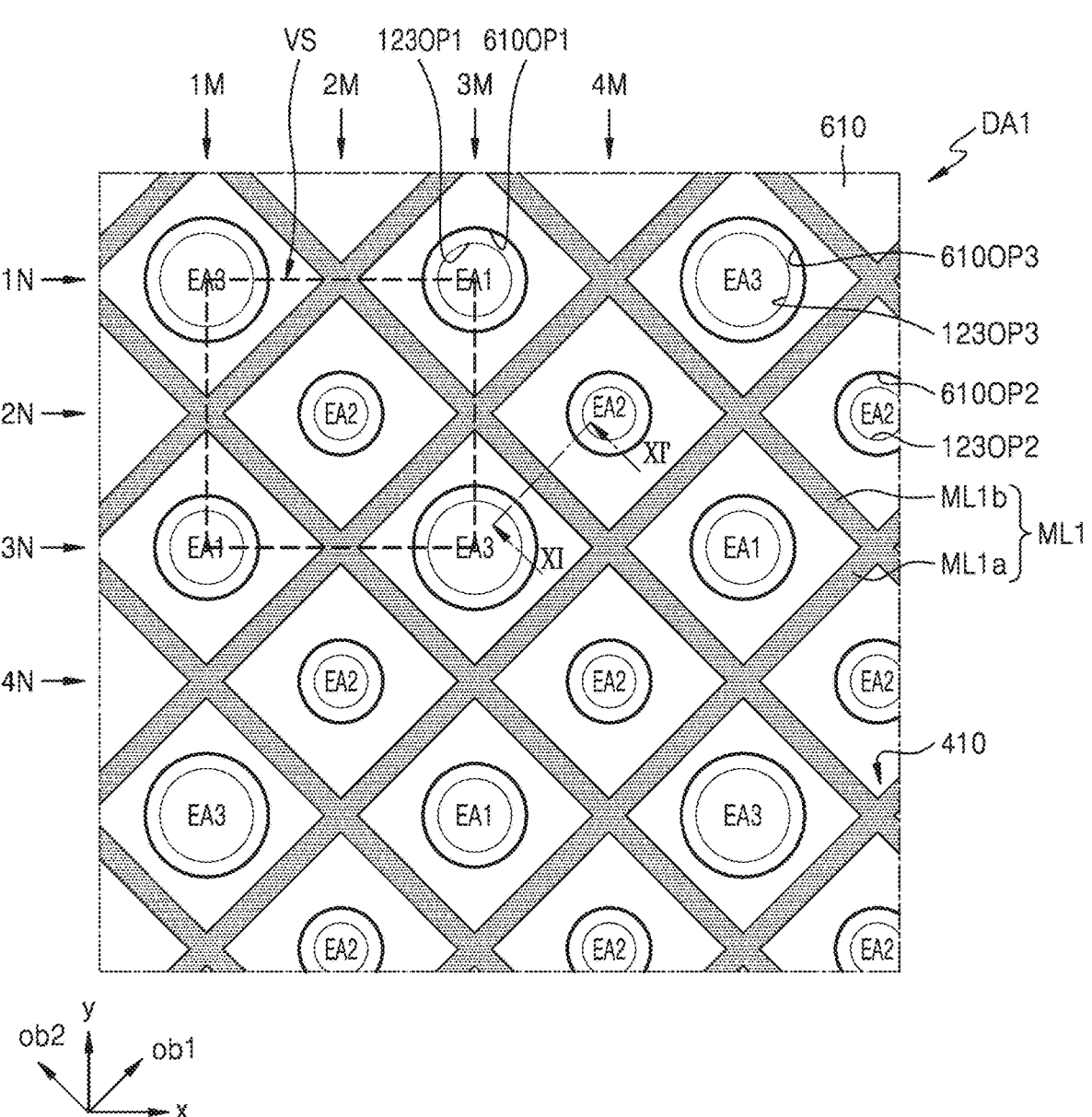
FIG. 9 is a plan view of a first display area taken from a display panel according to an embodiment of the present disclosure.
Figure 10:
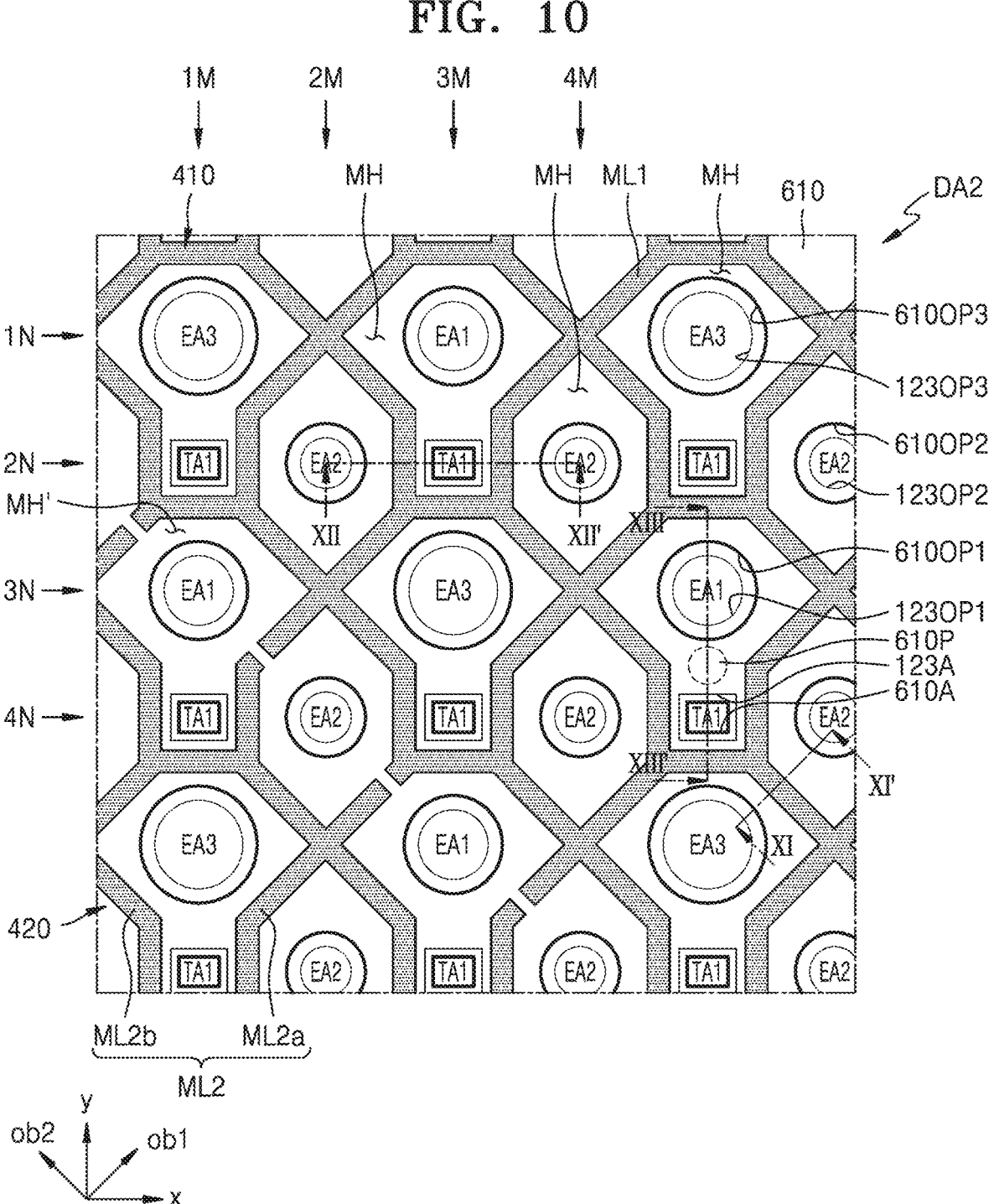
FIG. 10 is a plan view of a second display area taken from a display panel according to an embodiment of the present disclosure.

FIG. 9 is a plan view of a first display area DA1 taken from a display panel according to an embodiment of the present disclosure, and FIG. 10 is a plan view of a second display area DA2 taken from the display panel according to an embodiment of the present disclosure.

Referring to FIG. 9, first emission areas EA1, second emission areas EA2, and third emission areas EA3 may be disposed in the first display area DA1. The first through third emission areas EA1, EA2, and EA3 may emit different color light from one another by using various light-emitting diodes. One of the first through third emission areas EA1, EA2, and EA3 may correspond to a red emission area, another may correspond to a green emission area, and the other may correspond to a blue emission area.

Sizes of the first through third emission areas EA1, EA2, and EA3 may respectively be defined by a plurality of openings included in a bank layer. For example, the first emission area EA1 may be defined by a first opening 123OP1 of the bank layer, the second emission area EA2 may be defined by a second opening 123OP2 of the bank layer, and the third emission area EA3 may be defined by a third opening 123OP3 of the bank layer.

The first through third emission areas EA1, EA2, and EA3 may be disposed as a Pentile™ type, for example, a diamond Pentile™ type. Here, Pentile™ is an arrangement of five sub-pixels used in some display devices marketed by Samsung. The third emission areas EA3 and the first emission areas EA1 may be alternately disposed in a first row 1N in an x direction, the second emission areas EA2 may be spaced apart from each other in a second row 2N adjacent to the first row 1N, the first emission areas EA1 and the third emission areas EA3 may be alternately disposed in a third row 3N adjacent to the second row 2N, and the second emission areas EA2 may be spaced apart from each other in a fourth row 4N adjacent to the third row 3N. These arrangements of the first through third emission areas EA1, EA2, and EA3 may be repeated to an $N^{th}$ row. Here, the size (or the width) of the third emission area EA3 and the first emission area EA1 may be greater than the size (or the width) of the second emission area EA2.

The third emission areas EA3 and the first emission areas EA1 disposed in the first row 1N may be misaligned with the second emissions area EA2 disposed in the second row 2N. Thus, the third emission areas EA3 and the first emission areas EA1 may be alternately disposed in a first column 1M, the second emission areas EA2 may be spaced apart from each other in a second column 2M adjacent to the first column 1M, the first emission areas EA1 and the third emission areas EA3 may be alternately disposed in a third column 3M adjacent to the second column 2M, and the second emission areas EA2 may be spaced apart from each other in a fourth column 4M adjacent to the third column 3M, wherein these arrangements of the first through third emission areas EA1, EA2, and EA3 may be repeated to an $M^{th}$ column.

To express these arrangements of the first through third emission areas EA1, EA2, and EA3 in a different way, the first emission areas EA1 may be disposed at a first vertex and a third vertex that diagonally face each other of a virtual square VS, a center point of which corresponds to a center point of the second emission area EA2, and the third emission areas EA3 may be disposed at a second vertex and a fourth vertex that are the other vertexes of the virtual square VS. Here, the virtual square VS may be variously modified to include a rectangular shape, a diamond shape, a square shape, etc.

These arrangements of the first through third emission areas EA1, EA2, and EA3 may be referred to as a Pentile™ matrix structure or a Pentile™ structure. By implementing rendering that represents a color by sharing adjacent emission areas, high resolution may be realized with a small number of emission areas.

Referring to FIG. 10, first emission areas EA1, second emission areas EA2, and third emission areas EA3 emitting different color light from one another may be disposed in the second display area DA2. Sizes of the first through third emission areas EA1, EA2, and EA3 may be respectively defined by the first through third openings 123OP1, 123OP2, and 123OP3 of the bank layer, as described above.

The first display area DA1 and the second display area DA2 may have the same resolution. For example, based on a same area of the first and second display areas DA1 and DA2, an arrangement, an aperture ratio, and/or the number of first through third emission areas EA1, EA2, and EA3 in the second display area DA2, may be the same as an arrangement, an aperture ratio, and/or the number of first through third emission areas EA1, EA2, and EA3 in the first display area DA1. The emission areas, for example, the first through third emission areas EA1, EA2, and EA3, may each include a light-emitting diode, and thus, that the arrangement and/or the number of emission areas are (is) the same may indicate that an arrangement and/or the number of light-emitting diodes are (is) the same. For example, based on a same area between the first and second display areas DA1 and DA2, the arrangement and/or the number of light-emitting diodes arranged in the first display area DA1 may be the same as the arrangement and/or the number of light-emitting diodes arranged in the second display area DA2.

The second display area DA2 may include a first transmission area TA1, unlike the first display area DA1. The first transmission area TA1 may be disposed between adjacent emission areas. In some embodiments of the present disclosure, the first transmission area TA1 may be disposed in any one of two adjacent rows in a row direction (the x direction) and disposed in any one of two adjacent columns in a column direction (a y direction). For example, as illustrated in FIG. 10, the first transmission area TA1 may be disposed in a second row 2N and a fourth row 4N and a first column 1M and a third column 3M. The bank layer may include the light blocking material as described above. Thus, the bank layer may include an opening portion 123A corresponding to the first transmission area TA1 as illustrated in FIG. 10.

Referring to FIGS. 9 and 10, each of the first through third emission areas EA1, EA2, and EA3 may be surrounded by a conductive line of a touch electrode. As illustrated in FIGS. 9 and 10, the touch electrode, for example, the first touch electrode 410, may include a conductive mesh pattern including first conductive lines ML1. The first conductive lines ML1 may include first sub-conductive lines ML1$a$ extending in a first diagonal direction ob1 (a direction forming an acute angle with the x direction and the y direction) and second sub-conductive lines ML1$b$ extending in a second diagonal direction ob2 (a direction crossing the first diagonal direction). A plurality of mesh holes MH may be formed by crossing structures of the first sub-conductive lines ML1$a$ and the second sub-conductive lines ML1$b$ that are integrally formed with each other. Each of the mesh holes MH may have a boundary line of a closed-loop shape, and the mesh holes MH may be spaced apart from each other in a plan view and spatially separated from each other.

In some embodiments of the present disclosure, as illustrated in FIG. 10, the second touch electrode 420 may be arranged in the second display area DA2. The second touch electrode 420 may include a conductive mesh pattern including second conductive lines ML2. For example, the second conductive lines ML2 may include first sub-conductive lines ML2$a$ extending in a first diagonal direction ob1 and second sub-conductive lines ML2$b$ extending in a second diagonal direction ob2. A plurality of mesh holes MH may be formed by crossing structures of the first sub-conductive lines ML2$a$ and the second sub-conductive lines ML2$b$ of the second conductive lines ML2, which are integrally formed with each other. Each of the mesh holes MH of the second touch electrode 420 may have a boundary line of a closed-loop shape, and the mesh holes MH may be spaced apart from each other in a plan view and spatially separated from each other.

The first touch electrode 410 and the second touch electrode 420 may be electrically insulated from each other. With respect to this aspect, FIG. 10 illustrates that the first touch electrode 410 and the second touch electrode 420 may be physically apart from each other. Each of the emission areas, for example, the first and second emission areas EA1 and EA2 illustrated in FIG. 10, disposed in a space between the first touch electrode 410 and the second touch electrode 420, may be located in a hole (hereinafter, referred to as a space hole MH') formed between a portion of the second conductive line ML2 and a portion of the first conductive line ML1, the portions being adjacent to each other. The space hole MH' may be defined by a portion of the first conductive line ML1 and a portion of the second conductive line ML2, and the space holes MH' adjacent to each other may be spatially connected to each other in a plan view.

In the second display area DA2, the first transmission area TA1 may be located in the same mesh hole MH as any one emission area. With respect to this configuration, FIG. 10 illustrates that the first emission area EA1 and the first transmission area TA1 may be located in the same mesh hole MH, and the third emission area EA3 and the first transmission area TA1 may be located in the same mesh hole MH. The first emission area EA1 and the first transmission area TA1 located in the same mesh hole MH may be, in a plan view, completely surrounded by a portion of the conductive line, for example, the first conductive line ML1, of the touch electrode. Likewise, the third emission area EA3 and the first transmission area TA1 located in the same mesh hole MH may be, in a plan view, completely surrounded by a portion of the conductive line, for example, the first conductive line ML1, of the touch electrode.

By disposing the first transmission area TA1 while maintaining resolutions (for example, the number and/or an area of the emission areas for a same area) of the first display area DA1 and the second display area DA2 to be the same as each other, a size and a planar shape of the mesh hole MH located in the second display area DA2 may be different from a size and a planar shape of the mesh hole MH located in the first display area DA1. According to an embodiment of the present disclosure, the second emission area EA2 illustrated in FIG. 10 may be located in the mesh hole MH corresponding to the second emission area EA2 and not including the first transmission area TA1, and a size (or a width) of the mesh hole MH corresponding to the second emission area EA2 of the second display area DA2 may be less than a size (or a width) of the mesh hole MH corresponding to the second emission area EA2 of the first display area DA1 illustrated in FIG. 9.

The light blocking layer 610 may be disposed on the touch electrodes of FIGS. 9 and 10. The light blocking layer 610 may cover the conductive lines of the touch electrodes (for example, the first and second touch electrodes 410 and 420) and may include openings or opening portions corresponding to the first through third emission areas and the first transmission area T1. With respect to this configuration, FIGS. 9 and 10 illustrate that the light blocking layer 610 may include first through third openings 610OP1, 610OP2, and 610OP3 and a first transmissive opening portion 610A, wherein the first through third openings 610OP1, 610OP2, and 610OP3 may respectively correspond to the first through third emission areas EA1, EA2, and EA3 located in the first and second display areas DA1 and DA2, and the first transmissive opening portion 610A may correspond to the first transmission area TA1.

In a plan view, the first through third openings 610OP1, 610OP2, and 610OP3 of the light blocking layer 610 may be spaced apart from one another, and the first through third openings 610OP1, 610OP2, and 610OP3 may overlap the first through third openings 123OP1, 123OP2, and 123OP3 of the bank layer, respectively, the first through third openings 123OP1, 123OP2, and 123OP3 defining the first through third emission areas EA1, EA2, and EA3, respectively. Sizes (or widths) of the first through third openings 610OP1, 610OP2, and 610OP3 of the light blocking layer 610 may be greater than sizes (or widths) of the first through third openings 123OP1, 123OP2, and 123OP3 of the bank layer, the first through third openings 123OP1, 123OP2, and 123OP3 respectively defining the first through third emission areas EA1, EA2, and EA3.

In a plan view, the first transmissive opening portion 610A of the light blocking layer 610 may overlap the opening portion 123A of the bank layer. A size (or a width) of the first transmissive opening portion 610A of the light blocking layer 610 may be less than a size (or a width) of the opening portion 123A of the bank layer corresponding to the first transmission area TA1.

Figure 11:
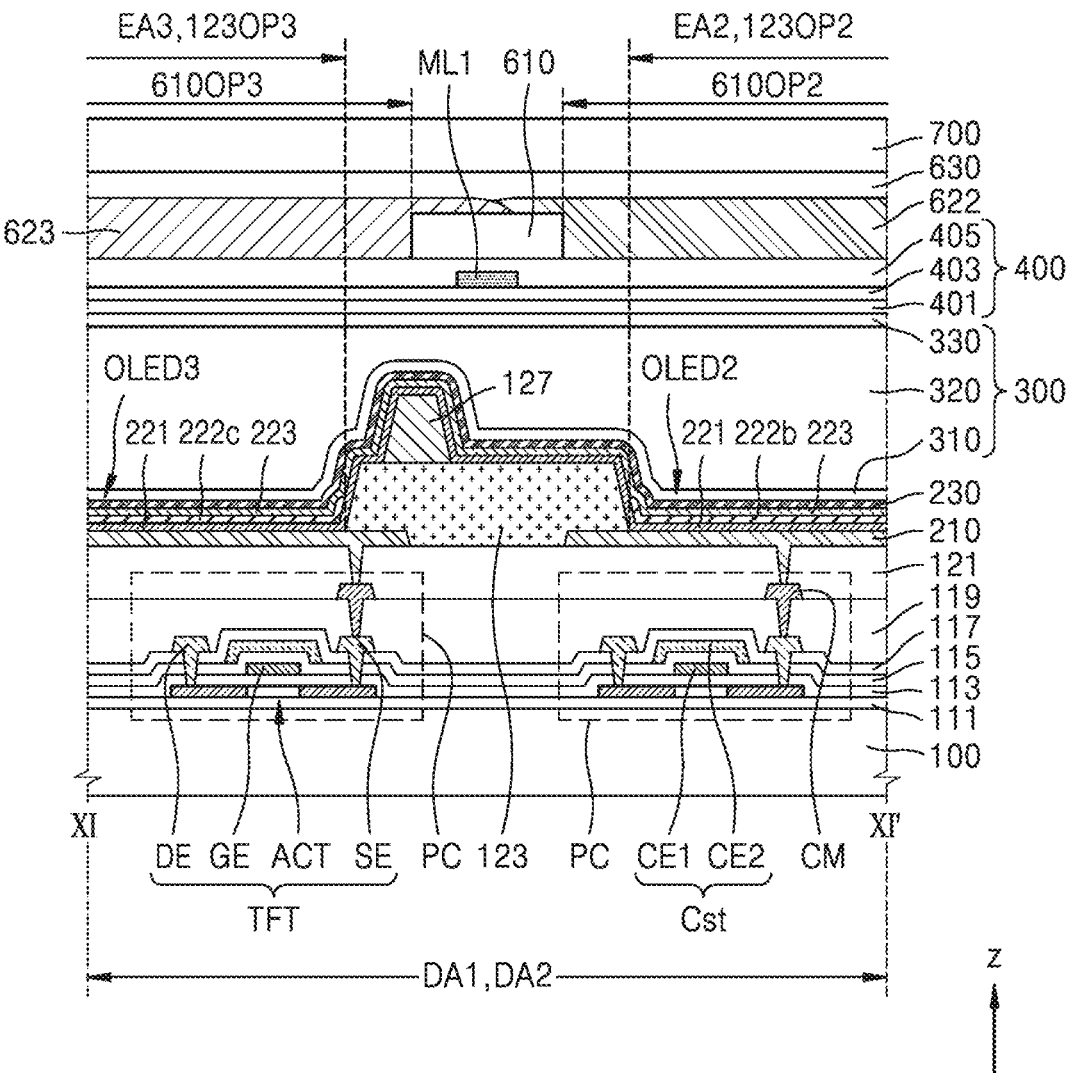
FIG. 11 is a cross-sectional view of a display panel according to an embodiment of the present disclosure, the cross-sectional view showing a cross-section of the display panel, taken along line XI-XI' of FIGS. 9 and 10.

FIG. 11 is a cross-sectional view of a display panel according to an embodiment of the present disclosure, the cross-sectional view showing a cross-section of the display panel, taken along line XI-XI' of FIGS. 9 and 10. FIG. 11 illustrates a cross-sectional structure of adjacent emission areas in the first and second display areas DA1 and DA2. In FIG. 11, the second emission area EA2 and the third emission area EA3 are illustrated. FIG. 11 illustrates a case in which the second emission area EA2 of the display panel may emit light by using a second organic light-emitting diode OLED2, and the third emission area EA3 may emit light by using a third organic light-emitting diode OLED3.

Referring to FIG. 11, the second organic light-emitting diode OLED2 and the third organic light-emitting diode OLED3 may be formed on the substrate 100. The substrate 100 may include a glass material or polymer resins. When the substrate 100 includes polymer resins, the substrate 100 may include a stack structure including a base layer including the polymer resins and a barrier layer including an inorganic insulating material.

A buffer layer 111 may be disposed on the substrate 100. The buffer layer 111 may reduce or prevent the penetration of impurities, moisture, or external substances from below the substrate 100. The buffer layer 111 may include an inorganic insulating material, such as silicon oxide, silicon oxynitride, and silicon nitride, and may include only a single layer or multiple layers including the inorganic insulating materials described above.

Each of the second organic light-emitting diode OLED2 and the third organic light-emitting diode OLED3 may be electrically connected to a pixel circuit PC. The second organic light-emitting diode OLED2 may be electrically connected to the pixel circuit PC between the substrate 100 and the second organic light-emitting diode OLED2, and the third organic light-emitting diode OLED3 may be electrically connected to the pixel circuit PC between the substrate 100 and the third organic light-emitting diode OLED3.

Each pixel circuit PC may include a thin-film transistor TFT and a storage capacitor Cst. The thin-film transistor TFT may include a semiconductor layer ACT, a gate electrode GE overlapping a channel area of the semiconductor layer ACT, and a source electrode SE and a drain electrode DE connected to a source area and a drain area of the semiconductor layer ACT, respectively. A gate insulating layer 113 may be disposed between the semiconductor layer ACT and the gate electrode GE, and a first interlayer insulating layer 115 and a second interlayer insulating layer 117 may be disposed between the gate electrode GE and the source electrode SE or between the gate electrode GE and the drain electrode DE.

The storage capacitor Cst may overlap the thin-film transistor TFT. The storage capacitor Cst may include a lower electrode CE1 and an upper electrode CE2 overlapping each other. In some embodiments of the present disclosure, the gate electrode GE of the thin-film transistor TFT may include the lower electrode CE1 of the storage capacitor Cst. The first interlayer insulating layer 115 may be disposed between the lower electrode CE1 and the upper electrode CE2.

The semiconductor layer ACT may include polysilicon. In some embodiments of the present disclosure, the semiconductor layer ACT may include amorphous silicon. In some embodiments of the present disclosure, the semiconductor layer ACT may include an oxide semiconductor of at least one material selected from the group consisting of In, Ga, Sn, Zr, V, Hf, Cd, Ge, Cr, Ti, and Zn. The semiconductor layer Act may include: a channel area; and a source area and a drain area doped with impurities.

The gate insulating layer 113 may include an inorganic insulating material, such as silicon oxide, silicon oxynitride, and silicon nitride, and may include only a single layer or multiple layers including the inorganic insulating materials described above.

The gate electrode GE or the lower electrode CE1 may include a low-resistance conductive material, such as Mo, Al, Cu, and/or Ti and may include only a single layer or multiple layers including the materials described above.

The first interlayer insulating layer 115 may include an inorganic insulating material, such as silicon oxide, silicon oxynitride, and silicon nitride, and may include only a single layer or multiple layers including the materials described above.

The upper electrode CE2 may include Al, Pt, Pd, Ag, Mg, Au, Ni, Nd, Ir, Cr, Ca, Mo, Ti, W, and/or Cu and may include only a single layer or multiple layers including the materials described above.

The second interlayer insulating layer 117 may include an inorganic insulating material, such as silicon oxide, silicon oxynitride, and silicon nitride, and may include only a single layer or multiple layers including the materials described above.

The source electrode SE and/or the drain electrode DE may include Al, Pt, Pd, Ag, Mg, Au, Ni, Nd, Ir, Cr, Ca, Mo, Ti, W, and/or Cu and may include only a single layer or multiple layers including the materials described above. For example, the source electrode SE and/or the drain electrode DE may have a triple-layered structure including a Ti layer/an Al layer/a Ti layer.

A first organic insulating layer 119 may be located on the thin-film transistor TFT, and the thin-film transistor TFT may be electrically connected to a first electrode 210 of an organic light-emitting diode corresponding to the thin-film transistor TFT through a connection electrode CM disposed on the first organic insulating layer 119. The connection electrode CM may be connected to the thin-film transistor TFT through a contact hole of the first organic insulating layer 119, and the first electrode 210 may be connected to the connection electrode CM through a contact hole of the second organic insulating layer 121.

The first organic insulating layer 119 and/or the second organic insulating layer 121 may include an organic insulating material, such as acryl, benzocyclobutene (BCB), PI, or hexamethyldisiloxame (HMDSO). In some embodiments of the present disclosure, the connection electrode CM and the second organic insulating layer 121 may be omitted. In this case, the first electrode 210 may be directly connected to the thin-film transistor TFT through the contact hole of the first organic insulating layer 119.

The second organic light-emitting diode OLED2 may include an overlapping structure of the first electrode 210, an emission layer 222b (hereinafter, referred to as a second emission layer), and a second electrode 230. The third organic light-emitting diode OLED3 may include an overlapping structure of the first electrode 210, an emission layer 222c (hereinafter, referred to as a third emission layer), and the second electrode 230. A first functional layer 221 and/or a second functional layer 223 may be included between the first electrode 210 and the second electrode 230.

The first electrode 210 may be located on the second organic insulating layer 121. The first electrode 210 may include a reflective layer including Ag, Mg, Al, Pt, Pd, Au, Ni, Nd, Ir, Cr, or a compound thereof. The first electrode 210 may include a reflective layer including the materials described above and a transparent conductive layer arranged above or/and below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to an embodiment of the present disclosure, the first electrode 210 may have a tri-layered structure of ITO/Ag/ITO layers.

A bank layer 123 may include a light blocking material. The bank layer 123 may have, for example, a black color. For example, the bank layer 123 may include a PI-based binder and a pigment in which red, green, and blue colors are combined. Alternatively, the bank layer 123 may include a cardo-based binder resin and a mixture of a lactam-based black pigment and a blue pigment. Alternatively, the bank layer 123 may include carbon black. The bank layer 123 may prevent the penetration of external light along with the reflection prevention layer 600 to be described below and may increase a contrast of the display panel.

A spacer 127 may be disposed on the bank layer 123. The spacer 127 may include a material different from that of the bank layer 123. For example, while the bank layer 123 may include a negative photosensitive material, the spacer 127 may include a positive photosensitive material. Also, the bank layer 123 and the spacer 127 may be formed by separate mask processes.

The second emission layer 222b and the third emission layer 222c may be located to correspond to the second opening 123OP2 and the third opening 123OP3 of the bank layer 123, respectively, and may overlap the first electrode 210. Each of the second emission layer 222b and the third emission layer 222c may include a high-molecular weight organic material or a low-molecular weight organic material emitting predetermined color light, and the second emission layer 222b and the third emission layer 222c may emit light of different colors from each other. The first functional layer 221 and the second functional layer 223 may be respectively formed below and above the second emission layer 222b and the third emission layer 222c.

The first functional layer 221 may include a hole transport layer (HTL) and/or a hole injection layer (HIL). The second functional layer 223 may include an electron transport layer (ETL) and/or an electron injection layer (EIL). The first functional layer 221 and/or the second functional layer 223 may be formed throughout the substrate 100 unlike the emission layer 222. In other words, the first functional layer 221 and/or the second functional layer 223 may cover the first display area DA1 and the second display area DA2.

The second electrode 230 may include a material having a relatively high work function. For example, the second electrode 230 may include a transmissive thin-film including Ag and Mg or another material with a work function that is similar to or greater than that of either Ag or Mg.

The encapsulation layer 300 may cover the emission areas, for example, the second and third organic light-emitting diodes OLED2 and OLED3. According to an embodiment of the present disclosure, the encapsulation layer 300 may include a first inorganic encapsulation layer 310, a second inorganic encapsulation layer 330, and an organic encapsulation layer 320 therebetween.

Each of the first and second inorganic encapsulation layers 310 and 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. The polymer-based material may include an acryl-based resin, an epoxy-based resin, PI, polyethylene, etc. For example, the organic encapsulation layer 320 may include an acryl-based resin, for example, polymethacrylate, polyacrylic acid, etc. The organic encapsulation layer 320 may be formed by curing a monomer or coating a polymer.

The input sensing layer 400 may include a first touch insulating layer 401 on the encapsulation layer 300, a second touch insulating layer 403 on the first touch insulating layer 401, and a third touch insulating layer 405 on the second touch insulating layer 403. The input sensing layer 400 may include a touch electrode, wherein the touch electrode may include a conductive line disposed above the second touch insulating layer 403 and below the third touch insulating layer 405. With respect to this configuration, FIG. 11 illustrates the first conductive line ML1 according to an embodiment of the present disclosure.

The conductive line, for example, the first conductive line ML1 of FIG. 11, may include Mo, Mb, Ag, Ti, Cu, Al, and an alloy thereof. The first conductive line ML1 may be covered by the light blocking layer 610 having a greater width than the first conductive line ML1.

The light blocking layer 610 may include the second opening 610OP2 and the third opening 610OP3 respectively overlapping the second and third emission areas EA2 and EA3. The second and third openings 610OP2 and 610OP3 of the light blocking layer 610 may have greater sizes (or widths) than the second and third openings 123OP2 and 123OP3 of the bank layer 123, respectively.

A second color filter 622 and a third color filter 623 may be disposed in the second and third openings 610OP2 and 610OP3 of the light blocking layer 610, respectively. The second and third color filters 622 and 623 may have colors corresponding to light emitted from the second and third emission areas EA2 and EA3, respectively. According to an embodiment of the present disclosure, when the second emission area EA2 emits green light, the second color filter 622 may be a green color filter, and when the third emission area EA3 emits blue light, the third color filter 623 may be a blue color filter.

The overcoat layer 630 may be disposed on the light blocking layer 610 and the color filters. The overcoat layer 630 may be a colorless transmissive layer not having a color of a band of visible light and may planarize an upper surface of the light blocking layer 610 and an upper surface of the color filters 620. The overcoat layer 630 may include a colorless transmissive organic material, such as an acryl-based resin, and may be covered by the window 700.

Figure 12:
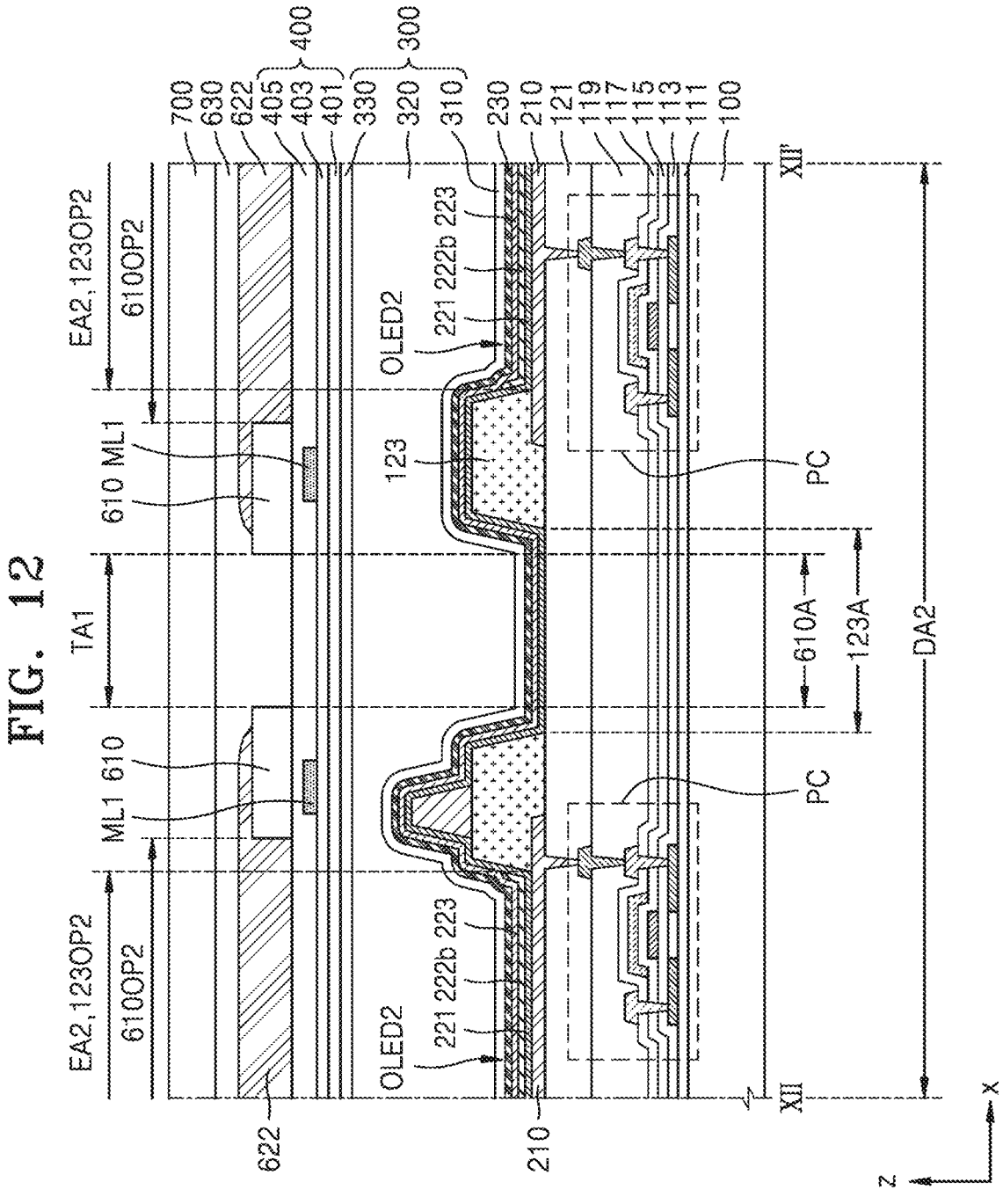
FIG. 12 is a cross-sectional view of a display panel according to an embodiment of the present disclosure, the cross-sectional view showing a cross-section of the display panel, taken along line XII-XII' of FIG. 10.

FIG. 12 is a cross-sectional view of a display panel according to an embodiment of the present disclosure, taken along line XII-XII' of FIG. 10.

Referring to FIG. 12, in the second display area DA2, the first transmission area TA1 may be disposed between two emission areas in a row direction (an x direction). According to an embodiment of the present disclosure, as illustrated in FIGS. 10 and 12, the first transmission area TA1 may be disposed between the second emission areas EA2 emitting the same color light.

The second organic light-emitting diodes OLED2 corresponding to the second emission areas EA2 may be arranged on the substrate 100 adjacent to each other. Each second organic light-emitting diode OLED2 may be electrically connected to the pixel circuit PC described above with reference to FIG. 11, and a detailed structure of the display panel may be the same as the structure described above with reference to FIG. 11. Thus, hereinafter, descriptions are given mainly based on differences.

The bank layer 123 may include the second openings 123OP2 defining the second emission areas EA2 and may include the opening portion 123A located between the two second openings 123OP2 and corresponding to the first transmission area TA1.

The input sensing layer 400 may be disposed on the encapsulation layer 300, and a portion of the conductive line included in the touch electrode of the input sensing layer 400 may surround each emission area, as described above with reference to FIG. 10. With respect to this configuration, FIG. 12 illustrates that the first conductive line ML1 overlaps a material portion of the bank layer 123 and does not overlap the second opening 123OP2 of the bank layer 123. The first conductive line ML1 may overlap the material portion of the bank layer 123 and may also overlap the light blocking layer 610.

The light blocking layer 610 may include the second opening 610OP2 overlapping each second emission area EA2 and may include the first transmissive opening portion 610A located between the two adjacent second openings 610OP2 and corresponding to the first transmission area TA1. The first transmissive opening portion 610A may be at least partially filled with a portion of the overcoat layer 630.

A size (or a width) of the first transmissive opening portion 610A of the light blocking layer 610 may be different from a size (or a width) of the opening portion 123A of the bank layer 123. For example, as illustrated in FIG. 12, the size (or the width) of the first transmissive opening portion 610A of the light blocking layer 610 may be less than the size (or the width) of the opening portion 123A of the bank layer 123, and in this case, a size (or a width) of the first transmission area TA1 may be defined by the first transmissive opening portion 610A of the light blocking layer 610, which is relatively smaller than the opening portion 123A of the bank layer 123.

Referring to FIG. 11, a portion of the light blocking layer 610, the portion covering the conductive line (for example, the first conductive line ML1) located between the adjacent emission areas, may overlap two color filters having different colors. However, referring to FIG. 12, a portion of the light blocking layer 610, the portion covering the conductive line (for example, the first conductive line ML1) located at opposite sides with the first transmission area TA1 therebetween, may be covered by only one color filter. As illustrated in FIG. 12, only the second color filter 622 may be located on portions of the light blocking layer 610, the portions being located at opposite sides with the first transmission area TA1 therebetween.

Figure 13:
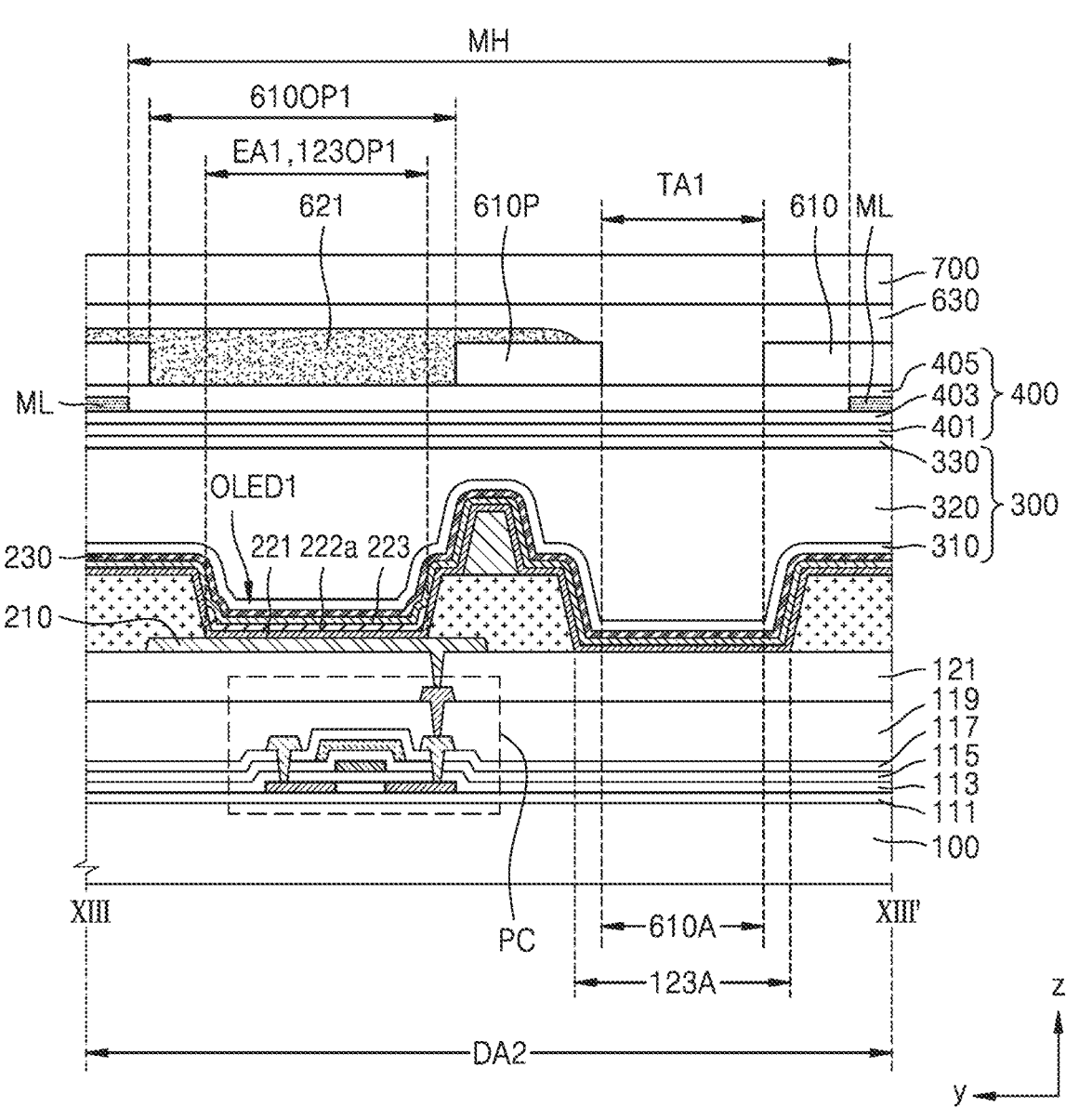
FIG. 13 is a cross-sectional view of a display panel according to an embodiment of the present disclosure, the cross-sectional view showing a cross-section of the display panel, taken along line XIII-XIII' of FIG. 10.

According to embodiments of the disclosure, two selected from the first through third color filters 621, 622, and 623 may overlap each other on the light blocking layer 610, or one color filter may be located on a portion of the light blocking layer 610, such as a partition portion 610P (see FIG. 13, around the first transmission area TA1).

According to a comparative embodiment, when all of the first through third color filters 621, 622, and 623 overlap one another on the light blocking layer 610, for example, when three color filters overlap one another, the overlapping portion may have an increased thickness, and thus, a portion of an upper surface of the overcoat layer 630, the portion corresponding to the overlapping portion of the three color filters, may have increased concavo-convex portions. To reduce the concavo-convex portions of the overcoat layer 630, the overcoat layer 630 may have an increased thickness. Thus, a general thickness of a display apparatus may be increased. However, according to an embodiment of the disclosure, two color filters selected from the three color filters may overlap each other or only one color filter may be located, on the light blocking layer 610, and thus, the problem described above may be prevented or minimized.

FIG. 13 is a cross-sectional view of a display panel according to an embodiment of the present disclosure, taken along line XIII-XIII' of FIG. 10.

Referring to FIG. 13, the first organic light-emitting diode OLED1 corresponding to the first emission area EA1 may be disposed on the substrate 100, and the first organic light-emitting diode OLED1 may include an emission layer 222a (hereinafter, referred to as a first emission layer) capable of emitting different color light from the second and third emission layers 222b and 222c described above. Structures above and below the first emission layer 222a, the first organic light-emitting diodes OLED1 each electrically connected to the pixel circuit PC, etc. are the same as described above with reference to FIG. 11. Thus, hereinafter, different aspects are mainly described.

The bank layer 123 may include the first opening 123OP1 defining the first emission area EA1 and the opening portion 123A corresponding to the first transmission area TA1.

The input sensing layer 400 may be disposed on the encapsulation layer 300, and the conductive line included in the touch electrode of the input sensing layer 400 may surround any one emission area and the first transmission area TA1, as described above with reference to FIG. 10. With respect to this aspect, FIG. 13 illustrates that the first emission area EA1 and the first transmission area TA1 may be disposed in one mesh hole MH surrounded by the first conductive line ML1.

The light blocking layer 610 may cover the conductive line, and a portion of the light blocking layer 610 may extend between the emission area and the first transmission area TA1 located in the same mesh hole MH. With respect to this aspect, FIGS. 10 and 13 illustrate that the light blocking layer 610 may include a portion (hereinafter, referred to as the partition portion 610P) between the first emission area EA1 and the first transmission area TA1 located in the same mesh hole MH. The first opening 610OP1 and the first transmissive opening portion 610A of the light blocking layer 610 may be located at opposite sides, respectively, with the partition portion 610P therebetween.

A size (or a width) of the first opening 610OP1 of the light blocking layer 610 may be greater than a size (or a width) of the first opening 123OP1 of the bank layer 123. A size (or a width) of the first transmissive opening portion 610A of the light blocking layer 610 may be less than a size (or a width) of the opening portion 123A of the bank layer 123.

A color filter corresponding to the light emitted from the first emission area EA1, for example, the first color filter 621, may be arranged in the first opening 610OP1 of the light blocking layer 610. Unlike other portions of the light blocking layer 610, the conductive line corresponding to the touch electrode might not be arranged below the partition portion 610P of the light blocking layer 610, and the partition portion 610P may overlap only one arbitrary color filter. For example, as illustrated in FIG. 13, any one selected from the first through third color filters, for example, only the first color filter 621 adjacent to the partition portion 610P, may be located on the partition portion 610P.

Figure 14:
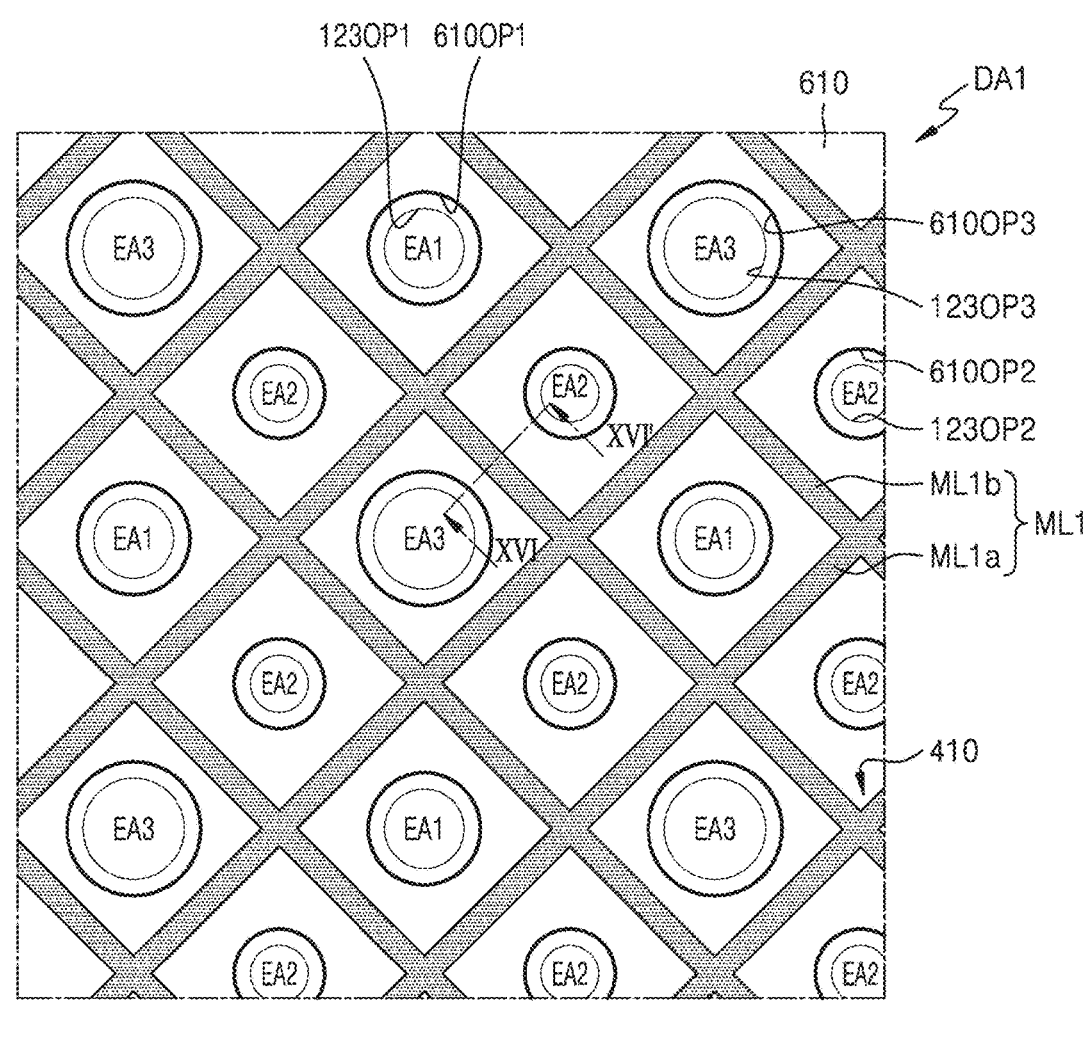
FIG. 14 is a plan view of a first display area taken from a display panel according to an embodiment of the present disclosure.
Figure 14:
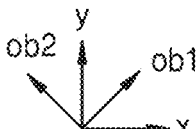
Figure 15:
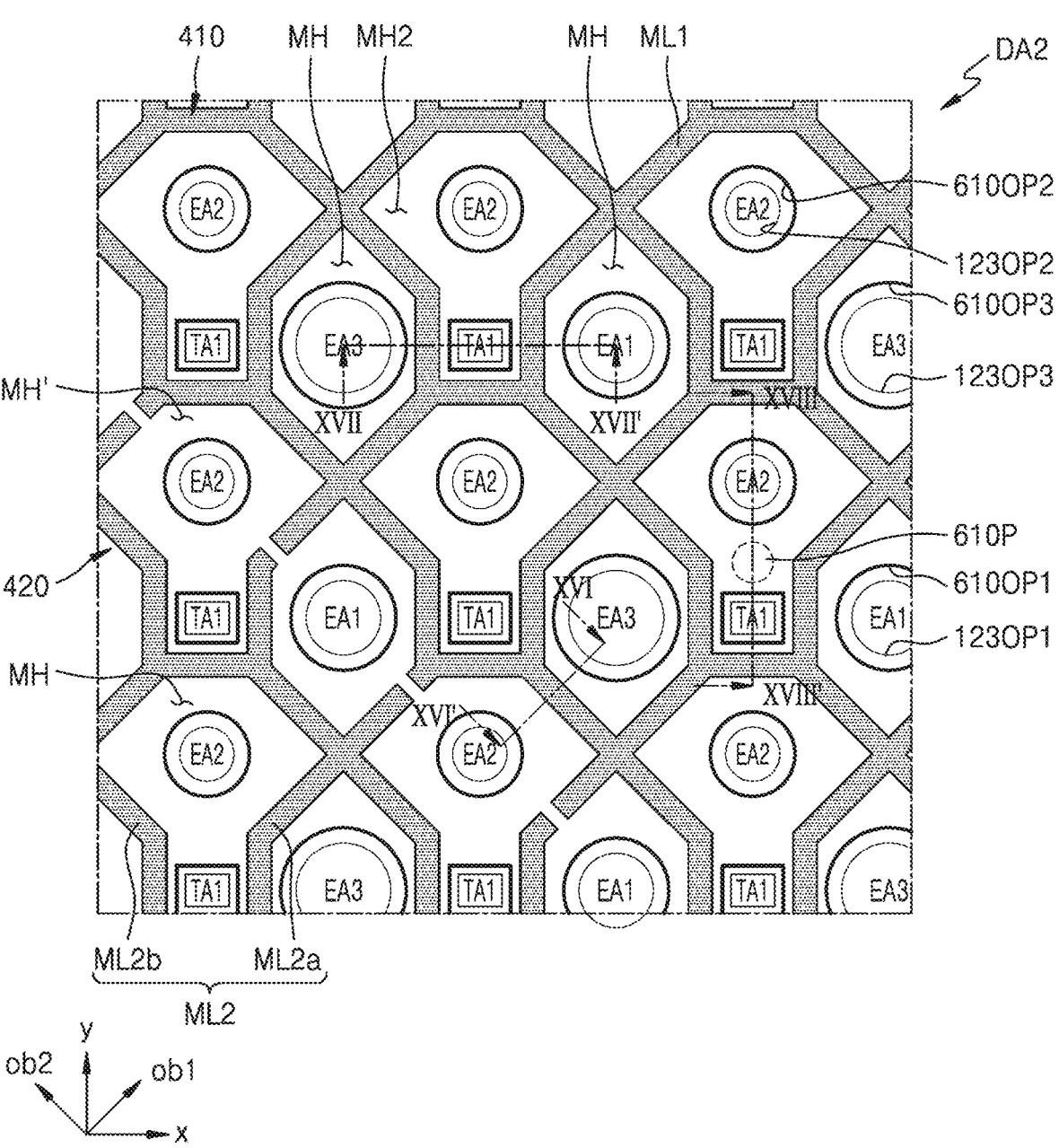
FIG. 15 is a plan view of a second display area taken from a display panel according to an embodiment of the present disclosure.

FIG. 14 is a plan view of a first display area DA1 taken from a display panel according to an embodiment of the present disclosure, and FIG. 15 is a plan view of a second display area DA2 taken from the display panel according to an embodiment of the present disclosure.

Referring to FIGS. 14 and 15, the first through third emission areas EA1, EA2, and EA3 may be disposed in the first and second display areas DA1 and DA2. The first through third emission areas EA1, EA2, and EA3 may be disposed as a Pentile™ type, for example, a diamond Pentile™ type. A resolution of the second display area DA2 illustrated in FIG. 15 may be the same as a resolution of the first display area DA1 illustrated in FIG. 14. For example, based on a same area of the first and second display areas DA1 and DA2, an arrangement, an aperture ratio, and/or the number of first through third emission areas EA1, EA2, and EA3 in the second display area DA2 may be the same as an arrangement, an aperture ratio, and/or the number of first through third emission areas EA1, EA2, and EA3 in the first display area DA1.

Referring to FIGS. 14 and 15, a touch electrode, for example, the first touch electrode 410 having a conductive mesh pattern, may be located in the first and second display areas DA1 and DA2. The first conductive lines ML1 of the first touch electrode 410 may include the first sub-conductive lines ML1*a* extending in the first diagonal direction ob1 and the second sub-conductive lines ML1*b* extending in the second diagonal direction ob2. The mesh holes MH may be formed by crossing structures of the first sub-conductive lines ML1*a* and the second sub-conductive lines ML1*b*, and one emission area may be located in each mesh hole HM.

In some embodiments of the present disclosure, as illustrated in FIG. 15, the second touch electrodes 420, spaced apart from the first touch electrodes 410 and having a conductive mesh pattern, may be located in the second display area DA2. The second touch electrode 420 may include the first and second sub-conductive lines ML2*a* and ML2*b*, and one emission area may be located in each of mesh holes MH formed by crossing structures of the first and second sub-conductive lines ML2*a* and ML2*b*. Also, the space hole MH' may be formed in an area between the first touch electrode 410 and the second touch electrode 420, and one emission area may be located in the space hole MH', as described above with reference to FIG. 10.

The light blocking layer 610 may cover the conductive lines of the touch electrodes and may include the first through third openings 610OP1, 610OP2, and 610OP3 respectively corresponding to the first through third emission areas EA1, EA2, and EA3, and the first transmissive opening portion 610A corresponding to the first transmission area TA1, as described above with reference to FIGS. 9 and 10.

The first opening 123OP1 of the bank layer and the first opening 610OP1 of the light blocking layer 610 defining the first emission area EA1 may be located in the same mesh hole MH, the second opening 123OP2 of the bank layer and the second opening 610OP2 of the light blocking layer 610 defining the second emission area EA2 may be located in the same mesh hole MH, and the third opening 123OP3 of the bank layer and the third opening 610OP3 of the light blocking layer 610 defining the third emission area EA3 may be located in the same mesh hole MH.

In a plan view, the first through third openings 610OP1, 610OP2, and 610OP3 of the light blocking layer 610 may overlap the first through third openings 123OP1, 123OP2, and 123OP3 of the bank layer, respectively. Sizes (or widths) of the first through third openings 610OP1, 610OP2, and 610OP3 of the light blocking layer 610 may be greater than sizes (or widths) of the first through third openings 123OP1, 123OP2, and 123OP3 of the bank layer, respectively.

In a plan view, the first transmissive opening portion 610A of the light blocking layer 610 may overlap the opening 123A of the bank layer. A size (or a width) of the first transmissive opening portion 610A of the light blocking layer 610 may be greater than a size (or a width) of the opening portion 123A of the bank layer corresponding to the first transmission area TA1.

Figure 16:
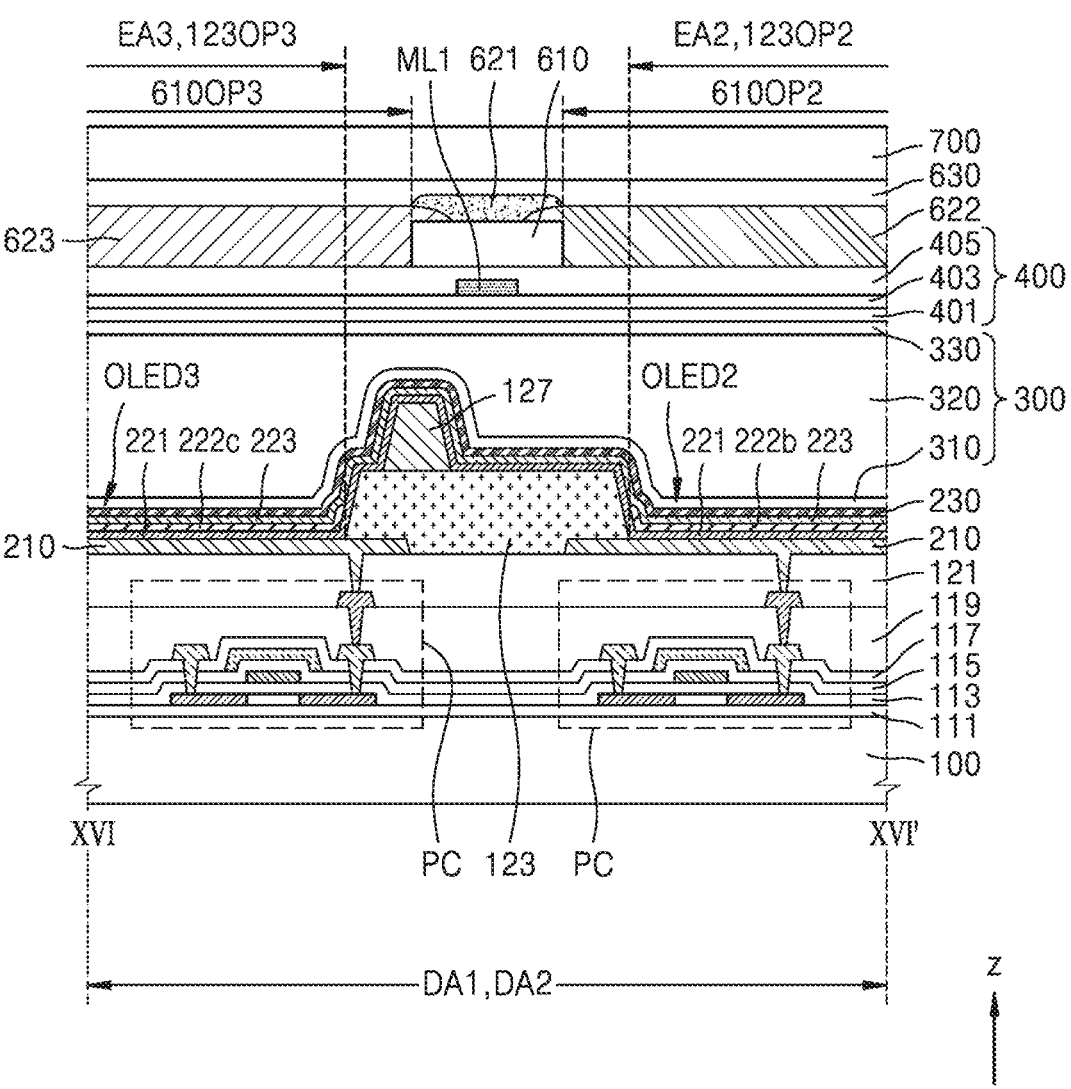
FIG. 16 is a cross-sectional view of a display panel according to an embodiment of the present disclosure, the cross-sectional view showing a cross-section of the display panel, taken along line XVI-XVI' of FIGS. 14 and 15.

FIG. 16 is a cross-sectional view of a display panel according to an embodiment of the present disclosure, taken along line XVI-XVI' of FIGS. 14 and 15. FIG. 16 illustrates a cross-sectional structure of adjacent emission areas in the first and second display areas DA1 and DA2 and illustrates the second emission area EA2 and the third emission area EA3. A structure of the display panel illustrated in FIG. 16 may be substantially the same as the structure of the display panel described above with reference to FIG. 11, and thus, hereinafter, different aspects are mainly described.

Referring to FIG. 16, three color filters having different colors from one another may overlap one another on the light blocking layer 610 located between adjacent light emission areas emitting different color light from each other, in the first and second display areas DA1 and DA2. As illustrated in FIG. 16, the second and third color filters 622 and 623 may be located on a portion of the light blocking layer 610, the portion covering the first conductive line ML1 between the second emission area EA2 and the third emission area EA3, and may be spaced apart from each other. The second and third color filters 622 and 623 located on the portion of the light blocking layer 610 may overlap the first color filter 621 having a different color therefrom. Each of the second and third color filters 622 and 623 may overlap the first color filter 621. According to a comparative embodiment, when all of the first through third color filters 621, 622, and 623 overlap one another, for example, when three color filters overlap one another, the overlapping portion may have an increased thickness, and thus, a portion of an upper surface of the overcoat layer 630, the portion corresponding to the overlapping portion of the three color filters, may have increased concavo-convex portions. To reduce the concavo-convex portions of the overcoat layer 630, the overcoat layer 630 may have an increased thickness. Thus, a general thickness of a display apparatus may be increased. However, according to an embodiment of the disclosure, two color filters selected from the three color filters may overlap each other or only one color filter may be located on the light blocking layer 610 and thus, the problem described above may be prevented or minimized.

In some embodiments of the present disclosure, an area of the light blocking layer 601, on which two color filters overlap each other, for example, an overlapping area of the first color filter 621 and the second color filter 622, might not overlap the first conductive line ML1, to effectively control the concavo-convex portions and the thickness of the over-coat layer 630. Likewise, an overlapping area of the light blocking layer 601, on which the first color filter 621 and the third color filter 623 overlap each other, might not overlap the first conductive line ML1, to effectively control the concavo-convex portions and the thickness of the overcoat layer 630.

Figure 17:
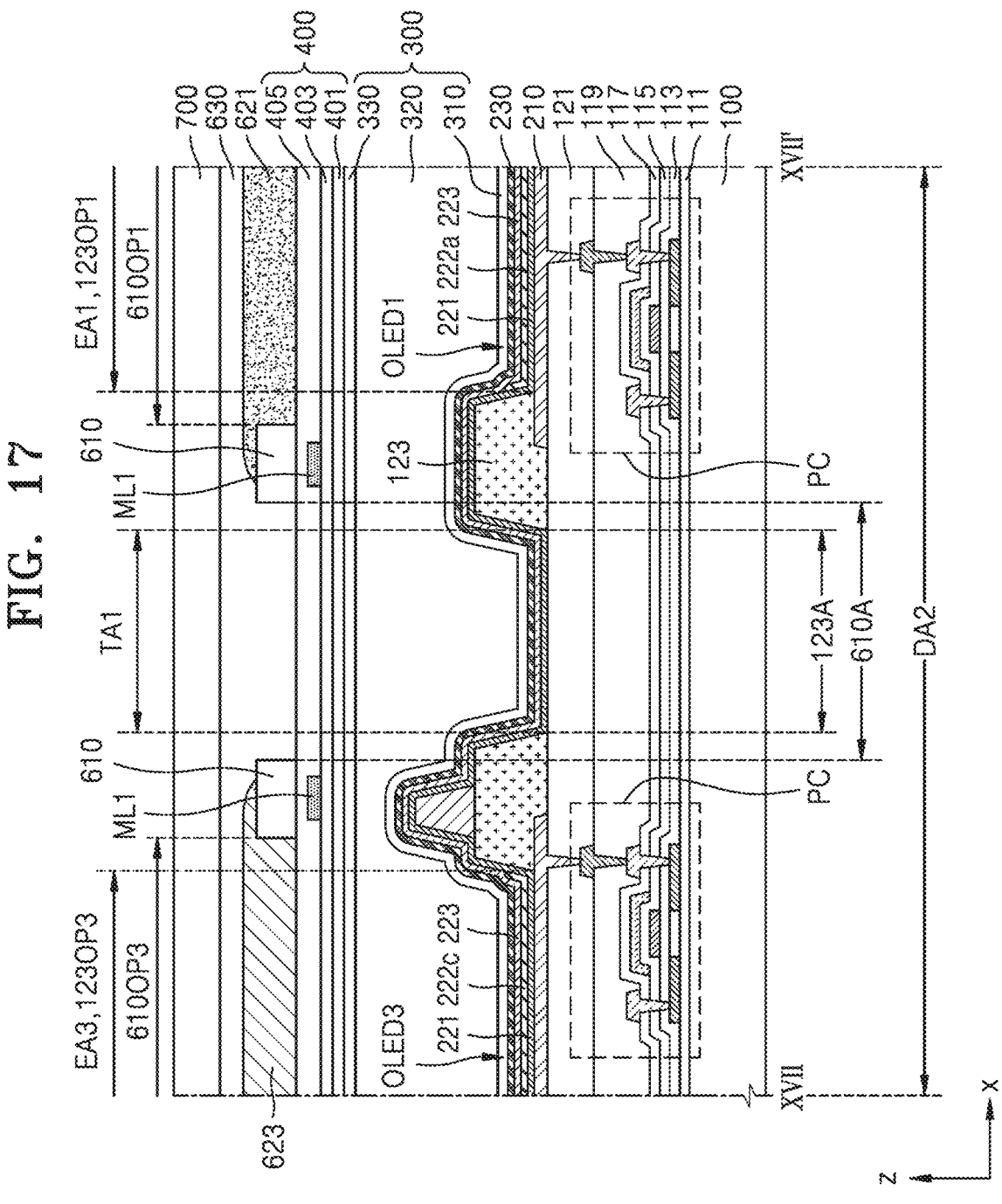
FIG. 17 is a cross-sectional view of the second display area of FIG. 15, taken along line XVII-XVII' of FIG. 15.

FIG. 17 is a cross-sectional view of a display panel according to an embodiment of the present disclosure, taken along line XVII-XVII' of FIG. 15.

In the second display area DA2, the first transmission area TA1 may be disposed between two emission areas in a row direction (an x direction). With respect to this aspect, FIG. 17 illustrates that the first transmission area TA1 may be disposed between the first emission area EA1 and the third emission area EA3.

The first and third organic light-emitting diodes OLED1 and OLED3 corresponding to the first and third emission areas EA1 and EA3, respectively, may be arranged on the substrate 100 adjacent to each other. Each of the first and third organic light-emitting diodes OLED1 and OLED3 may be electrically connected to the pixel circuit PC as described above with reference to FIG. 11, and a detailed structure of the display panel is the same as described above with reference to FIG. 11. Thus, hereinafter, descriptions are given mainly based on different aspects.

The bank layer 123 may include the first and third openings 123OP1 and 123OP3 defining the first and third emission areas EA1 and EA3, respectively, and the opening portion 123A corresponding to the first transmission area TA1 may be disposed between the first and third openings 123OP1 and 123OP3.

The input sensing layer 400 may be disposed on the encapsulation layer 300, and the conductive lines included in the touch electrodes of the input sensing layer 400 may surround each emission area, as illustrated in FIG. 15. With respect to this aspect, FIG. 17 illustrates that the first conductive line ML1 may overlap a material portion of the bank layer 123. The first conductive line ML1 may overlap the material portion of the bank layer 123 and may also overlap the light blocking layer 610.

The light blocking layer 610 may include the first and third openings 610OP1 and 610OP3 overlapping the first and third openings 123OP1 and 123OP3 of the bank layer 123, respectively, and may include the first transmissive opening portion 610A corresponding to the first transmission area TA1 and located between the first and third openings 610OP1 and 610OP3 adjacent to each other. The first transmissive opening portion 610A may be at least partially filled with a portion of the overcoat layer 630.

A size (or a width) of the first transmissive opening portion 610A of the light blocking layer 610 may be different from a size (or a width) of the opening portion 123A of the bank layer 123. For example, as illustrated in FIG. 17, the size (or the width) of the first transmissive opening portion 610A of the light blocking layer 610 may be greater than the size (or the width) of the opening portion 123A of the bank layer 123, and in this case, a size (or a width) of the first transmission area TA1 may be defined by the opening portion 123A of the bank layer 123, which is relatively smaller than the first transmissive opening portion 610A of the light blocking layer 610.

As illustrated in FIG. 16, a portion of the light blocking layer 610, the portion covering the conductive line (for example, the first conductive line ML1) located between the adjacent emission areas, may overlap the plurality of color filters. However, referring to FIG. 17, a portion of the light blocking layer 610, the portion covering the conductive line (for example, the first conductive line ML1) located at opposite sides of the first transmission area TA1, may be covered by only one color filter. As illustrated in FIG. 17, a portion of the light blocking layer 610, the portion being located at a side of the first transmission area TA1, may be covered by only the third color filter 623, and a portion of the light blocking layer 610, the portion being located at the other side, may be covered by only the first color filter 621.

Figure 18:
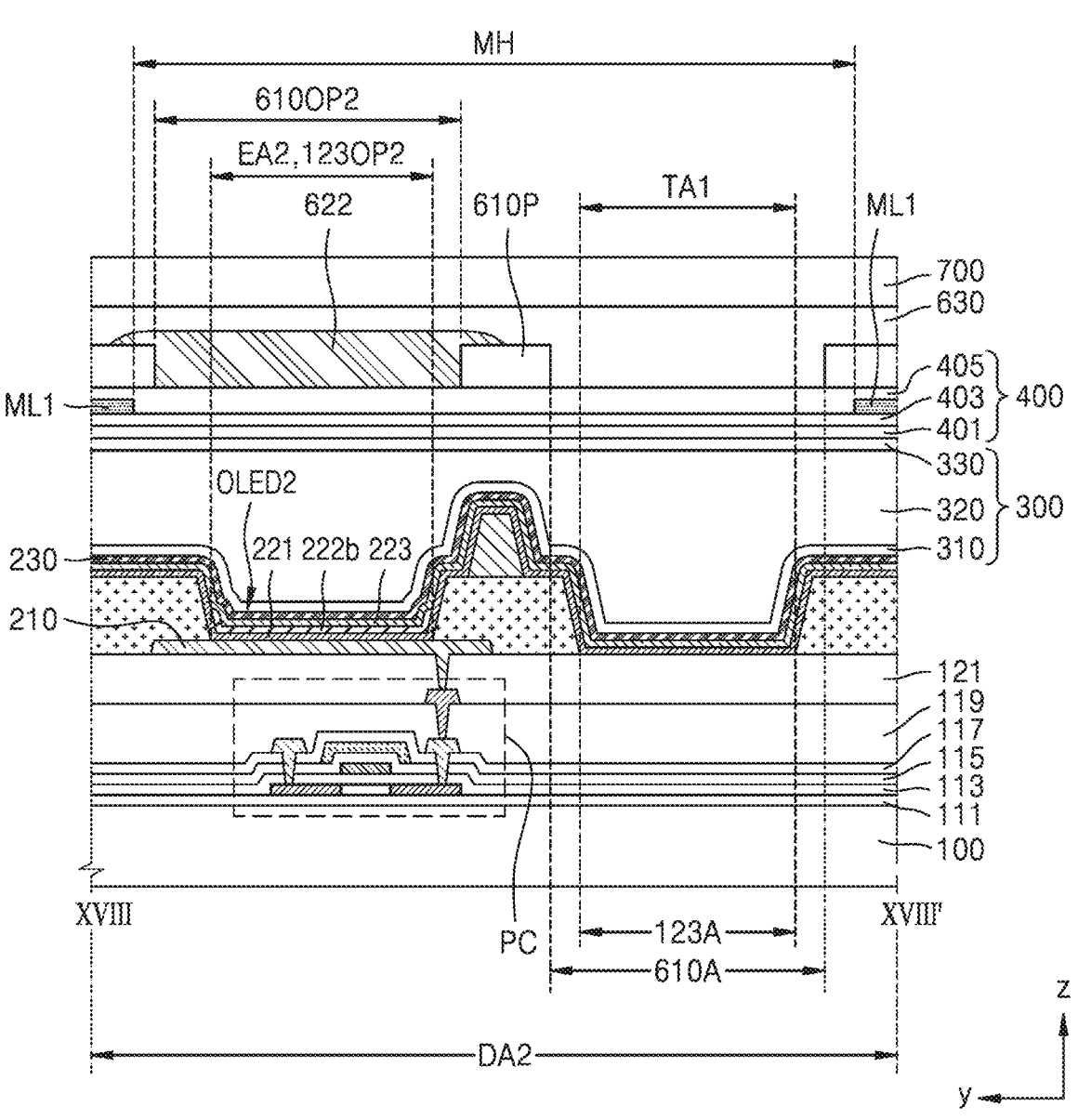
FIG. 18 is a cross-sectional view of the second display area of FIG. 15, taken along line XVIII-XVIII' of FIG. 15.

FIG. 18 is a cross-sectional view of a display panel according to an embodiment of the present disclosure, taken along line XVIII-XVIII' of FIG. 15.

Referring to FIG. 18, the second organic light-emitting diode OLED2 corresponding to the second emission area EA2 may be disposed on the substrate 100, and the second organic light-emitting diode OLED2 may be electrically connected to the pixel circuit PC.

The bank layer 123 may include the second opening 123OP2 defining the second emission area EA2 and the opening portion 123A corresponding to the first transmission area TA1.

The input sensing layer 400 may be disposed on the encapsulation layer 300, and the conductive line included in the touch electrode of the input sensing layer 400 may surround any one emission area and the first transmission area TA1 as described above with reference to FIG. 15. With respect to this aspect, FIG. 18 illustrates that the second emission area EA2 and the first transmission area TA1 may be disposed in one mesh hole MH surrounded by the first conductive line ML1.

The light blocking layer 610 may cover the conductive line (for example, the first conductive line ML1), and a portion of the light blocking layer 610 may extend between an emission area and the first transmission area TA1 located in the same mesh hole MH. With respect to this aspect, FIGS. 15 and 18 illustrate a portion of the light blocking layer 610 (hereinafter, referred to as the partition portion 610P), the portion being located between the second emission area EA2 and the first transmission area TA1 located in the same mesh hole MH. The second opening 610OP2 and the first transmissive opening portion 610A of the light blocking layer 610 may be located at opposite sides with the partition portion 610P therebetween.

A size (or a width) of the second opening 610OP2 of the light blocking layer 610 may be greater than a size (or a width) of the second opening 123OP2 of the bank layer 123. A size (or a width) of the first transmissive opening portion 610A of the light blocking layer 610 may be greater than a size (or a width) of the opening portion 123A of the bank layer 123.

A color filter corresponding to the light emitted from the second emission area EA2, for example, the second color filter 622, may be arranged in the second opening 610OP2 of the light blocking layer 610. Unlike other portions of the light blocking layer 610, the conductive line corresponding to the touch electrode might not be disposed below the partition portion 610P of the light blocking layer 610, and the partition portion 610P may overlap only one arbitrary color filter. For example, as illustrated in FIG. 18, any one selected from the first through third color filters, for example, only the second color filter 622 adjacent to the partition portion 610P, may be located on the partition portion 610P.

It is described with reference to FIGS. 1 through 18 that the reflection prevention layer 600 may include the light blocking layer 610, and the first through third color filters 621 through 623 may be arranged in the first through third openings 610OP1 through 610OP3 of the light blocking layer 610, respectively. However, the disclosure is not limited thereto. According to another embodiment, the reflection prevention layer 600 may include a reflection adjustment layer arranged on the light blocking layer 610, rather than the first through third color filters 621 through 623. The reflection adjustment layer may selectively absorb light of a wavelength in a band from light reflected from the inside of a display apparatus or light incident from the outside of the display apparatus.

It is illustrated in FIGS. 9 through 18 that the first color filter 621 may be arranged in the first opening 610OP1 of the light blocking layer 610, the second color filter 622 may be arranged in the second opening 610OP2 of the light blocking layer 610, and the third color filter 623 may be arranged in the third opening 610OP3 of the light blocking layer 610. However, according to another embodiment, the reflection adjustment layer may be arranged in each of the first through third openings 610OP1 through 610OP3 of the light blocking layer 610.

For example, the reflection adjustment layer may absorb a first wavelength region of about 490 nm to about 505 nm and a second wavelength region of about 585 nm to about 600 nm, and thus, a light transmission rate in the first wavelength region and the second wavelength region may be less than or equal to about 40%. The reflection adjustment layer may absorb light of a wavelength deviating from a wavelength range of red, green, and blue light emitted from the light-emitting diodes (for example, the first through third organic light-emitting diodes OLED1 through OLED3) arranged in the first through third emission areas EA1 through EA3, respectively. As described above, because the reflection adjustment layer may absorb the light of the wavelength not included in the wavelength range of the red, green, or blue light emitted from the light-emitting diodes, brightness reduction of the display apparatus may be prevented or minimized, and at the same time, degradation of emission efficiency of the display apparatus may be prevented or minimized and visibility may be improved.

The reflection adjustment layer may include an organic material layer including a dye, a pigment, or a combination thereof. The reflection adjustment layer may include a tetra aza porphyrin (TAP)-based compound, a porphyrin-based compound, a metal porphyrin-based compound, an oxazine-based compound, a squarylium-based compound, a triaryl-methane-based compound, a polymethine-based compound, a anthraquinone-based compound, a phthalocyanine-based compound, an azo-based compound, a perylene-based compound, a xanthene-based compound, a dimonium-based compound, a dipyrromethene-based compound, a cyanine-based compound, and a combination thereof.

According to an embodiment, the reflection adjustment layer may have a transmission rate of about 64% to about 72%. The transmission rate of the reflection adjustment layer may be adjusted according to a content of the dye and/or the pigment included in the reflection adjustment layer. The reflection adjustment layer may be arranged in the first through third emission areas EA1 through EA3 but may not be arranged in the transmission area TA. The light blocking layer 610 may include the first transmissive opening portion 610A in the transmission area TA, and a portion of the overcoat layer 630, rather than the reflection adjustment layer, may be arranged in the first transmissive opening portion 610A.

According to an embodiment in which the reflection adjustment layer is provided, a capping layer and a low reflection layer may be additionally formed between the second electrode 230 of the light-emitting diode and the encapsulation layer 300.

The capping layer may improve the emission efficiency of the light-emitting diode based on the constructive interference principle. The capping layer may include, for example, a material having a refractivity that is greater than or equal to about 1.6 with respect to light having a wavelength of about 589 nm.

The capping layer may include an organic capping layer including an organic material, an inorganic capping layer including an inorganic material, or a composite capping layer including an organic material and an inorganic material. For example, the capping layer may include a carbocyclic compound, a heterocyclic compound, an amine-group-containing compound, porphine derivatives, phthalocyanine derivatives, naphthalocyanine derivatives, an alkali metal complex, an alkali earth metal complex, or an arbitrary combination thereof. The carbocyclic compound, the heterocyclic compound, and the amine-group-containing compound may be selectively substituted by a substituent including O, N, S, Se, Si, F, Cl, Br, I, or an arbitrary combination thereof.

The low reflection layer may be arranged on the capping layer. The low reflection layer may include an inorganic material having a low reflectivity. According to an embodiment, the low reflection layer may include a metal or a metal oxide. When the low reflection layer includes a metal, the low reflection layer may include, for example, Yb, Bi, Co, Mo, Ti, Zr, Al, Cr, Nb, Pt, W, In, Sn, Fe, Ni, Ta, Mn, Zn, Ge, Ag, Mg, Au, Cu, Ca, or a combination thereof. Also, when the low reflection layer includes a metal oxide, the low reflection layer may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof.

According to an embodiment, an absorption coefficient (k) of the inorganic material included in the low reflection layer may be less than or equal to 4.0 and greater than or equal to 0.5 ($0.5 \leq k \leq 4.0$). Also, the inorganic material included in the low reflection layer may have a refractivity (n) that is greater than or equal to 1 ($n \geq 1.0$).

The low reflection layer may derive extinction interference between light incident into the display apparatus and light reflected from the metal arranged in a lower portion of the low reflection layer, thereby reducing the reflectivity of external light. Thus, by reducing the reflectivity of external light of the display apparatus by using the low reflection layer, the display quality and visibility of the display apparatus may be improved.

According to an embodiment, the capping layer may be omitted, and the low reflection layer may contact the second electrode 230 of the light-emitting diode.

As described above, according to the one or more of the above embodiments of the present disclosure, the second display area, in which components are arranged, might not have the degradation of resolution, while sufficiently securing the transmission area. Also, the concavo-convex portions of the upper surface of the reflection prevention layer including the color filters may be minimized by using the structure of the light blocking layer and the bank layer. Simultaneously, display quality, such as an increased contrast, may be sufficiently obtained. However, these objectives are examples and do not necessarily limit the scope of the disclosure.

It should be understood that embodiments of the present disclosure described herein should be considered in a descriptive sense and not necessarily as limiting. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. An electronic apparatus, comprising:
a display panel comprising: a plurality of emission areas arranged in a first display area and a second display area, each of the plurality of emission areas being configured to emit light of a single color, the second display area at least partially surrounded by the first display area;
and a transmission area disposed between two adjacent emission areas, of the plurality of emission areas, in the second display area; and
a first component disposed below the display panel and corresponding to the second display area,
wherein the display panel further comprises:
an encapsulation layer disposed on the plurality of emission areas;
an input sensing layer disposed on the encapsulation layer and including a plurality of touch electrodes; and
a reflection prevention layer disposed on the input sensing layer and including a light blocking layer and a plurality of color filters, wherein the light blocking layer includes a plurality of opening portions overlapping the plurality of emission areas, and the plurality of color filters overlap the plurality of emission areas,
wherein each of the plurality of touch electrodes includes a conductive mesh pattern including a plurality of mesh holes,
wherein a particular emission area, of the plurality of emission areas, disposed in the second display area, the transmission area, and a light blocking area are disposed in a same mesh hole, of the plurality of mesh holes, in a plan view, and
wherein the particular emission area is a single emission area.

2. The electronic apparatus of claim 1, wherein the light blocking layer overlaps the conductive mesh pattern and includes a partition portion extending between the particular emission area and the transmission area disposed in the same mesh hole and corresponding to a part of the light blocking area.

3. The electronic apparatus of claim 2, wherein the partition portion of the light blocking layer is overlapped by a color filter, of the plurality of color filters, that is disposed on the particular emission area.

4. The electronic apparatus of claim 2, wherein each of the plurality of emission areas includes:
a light-emitting diode including a first electrode, an emission layer disposed on the first electrode, and a second electrode on the emission layer; and
a bank layer covering an edge of the first electrode and having a first opening overlapping the first electrode and a second opening corresponding to the transmission area,
wherein a width of each of the plurality of emission areas is defined by the first opening of the bank layer.

5. The electronic apparatus of claim 1, wherein a number of emission areas, of the plurality of emission areas, disposed in the first display area is the same as a number of emission areas, of the plurality of emission areas, disposed in the second display area, for a given area.

6. The electronic apparatus of claim 1, wherein the light blocking layer includes a transmissive opening portion corresponding to the transmission area,
wherein the reflection prevention layer further includes an overcoat layer disposed on the plurality of color filters and the light blocking layer, and
wherein a portion of the overcoat layer at least partially fills the transmissive opening portion.

7. The electronic apparatus of claim 1, wherein the plurality of emission areas includes adjacent emission areas disposed in the second display area and emitting light of different colors from each other,
wherein the plurality of color filters includes a first color filter and a second color filter respectively disposed on the adjacent emission areas, and
wherein the first color filter and the second color filter overlap each other on a portion of the light blocking layer, the portion corresponding to a space between the adjacent emission areas.

8. The electronic apparatus of claim 1, wherein the plurality of emission areas includes the adjacent emission areas disposed in the second display area and emitting light of different colors from each other,
wherein the plurality of color filters includes a first color filter and a second color filter respectively disposed on the adjacent emission areas, and
wherein the first color filter and the second color filter overlap a third color filter, of the plurality of color filters, disposed on a portion of the light blocking layer, the portion corresponding to a space between the adjacent emission areas, wherein the third color filter is of a different color than the first and second color filters.

9. The electronic apparatus of claim 8, wherein a conductive line corresponding to any one of the plurality of touch electrodes is disposed below the portion of the light blocking layer,
wherein on the portion of the light blocking layer, a first overlapping area between the first color filter and the third color filter does not overlap the conductive line, and
wherein a second overlapping area between the second color filter and the third color filter does not overlap the conductive line.

10. The electronic apparatus of claim 1, wherein the first component includes a sensor.

11. An electronic apparatus, comprising:
a display panel comprising: a plurality of emission areas arranged in a first display area and a second display area, the second display area at least partially surrounded by the first display area; and a transmission area disposed between two adjacent emission areas, of the plurality of emission areas, in the second display area; and
a first component disposed below the display panel and corresponding to the second display area,
wherein the display panel further comprises:
an encapsulation layer disposed on the plurality of emission areas;
an input sensing layer disposed on the encapsulation layer and including a plurality of touch electrodes; and
a reflection prevention layer disposed on the input sensing layer and including a light blocking layer and a plurality of color filters, wherein the light blocking layer includes a plurality of opening portions overlapping the plurality of emission areas, and the plurality of color filters overlap the plurality of emission areas, wherein each of the plurality of touch electrodes includes a conductive mesh pattern including a plurality of mesh holes, wherein a particular emission area, of the plurality of emission areas, disposed in the second display area and the transmission area are disposed in a same mesh hole, of the plurality of mesh holes, in a plan view, and wherein a shape of the same mesh hole that includes the transmission area along with the particular emission area is a polygon having more sides than a polygonal shape of another mesh hole that does not include the transmission area in which another emission area disposed in the second display area is located, in a plan view.

12. The electronic apparatus of claim 11, wherein the light blocking layer comprises a partition portion, and the partition portion overlaps the same mesh hole and extends between the particular emission area and the transmission area disposed in the same mesh hole.

13. The electronic apparatus of claim 12, wherein the partition portion of the light blocking layer is overlapped by a color filter, of the plurality of color filters, that is disposed on the particular emission area.

14. The electronic apparatus of claim 12, wherein each of the plurality of emission areas includes:

a light-emitting diode including a first electrode, an emission layer disposed on the first electrode, and a second electrode on the emission layer; and a bank layer covering an edge of the first electrode and having a first opening overlapping the first electrode and a second opening corresponding to the transmission area, wherein a width of each of the plurality of emission areas is defined by the first opening of the bank layer.

15. The electronic apparatus of claim 13, wherein a number of emission areas, of the plurality of emission areas, disposed in the first display area is the same as a number of emission areas, of the plurality of emission areas, disposed in the second display area, for a given area.

16. The electronic apparatus of claim 13, wherein the light blocking layer includes a transmissive opening portion corresponding to the transmission area, wherein the reflection prevention layer further includes an overcoat layer disposed on the plurality of color filters and the light blocking layer, and wherein a portion of the overcoat layer at least partially fills the transmissive opening portion.

17. The electronic apparatus of claim 13, wherein the plurality of emission areas includes adjacent emission areas disposed in the second display area and emitting light of different colors from each other, wherein the plurality of color filters includes a first color filter and a second color filter respectively disposed on the adjacent emission areas, and wherein the first color filter and the second color filter overlap each other on a portion of the light blocking layer, the portion corresponding to a space between the adjacent emission areas.

18. The electronic apparatus of claim 13, wherein the plurality of emission areas includes the adjacent emission areas disposed in the second display area and emitting light of different colors from each other, wherein the plurality of color filters includes a first color filter and a second color filter respectively disposed on the adjacent emission areas, and wherein the first color filter and the second color filter overlap a third color filter, of the plurality of color filters, disposed on a portion of the light blocking layer, the portion corresponding to a space between the adjacent emission areas, wherein the third color filter is of a different color than the first and second color filters.

19. The electronic apparatus of claim 13, wherein a conductive line corresponding to any one of the plurality of touch electrodes is disposed below the portion of the light blocking layer, wherein on the portion of the light blocking layer, a first overlapping area between the first color filter and the third color filter does not overlap the conductive line, and wherein a second overlapping area between the second color filter and the third color filter does not overlap the conductive line.

20. The electronic apparatus of claim 13, wherein the first component includes a light sensor or a camera.

* * * * *